(12) United States Patent
Nakajima

(10) Patent No.: US 11,647,630 B2
(45) Date of Patent: May 9, 2023

(54) SEMICONDUCTOR MEMORY DEVICE

(71) Applicant: KIOXIA CORPORATION, Tokyo (JP)

(72) Inventor: Yumi Nakajima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/782,697

(22) Filed: Feb. 5, 2020

(65) Prior Publication Data

US 2021/0082946 A1   Mar. 18, 2021

(30) Foreign Application Priority Data

Sep. 17, 2019 (JP) ............................. JP2019-168666

(51) Int. Cl.
| | |
|---|---|
| *H01L 27/11582* | (2017.01) |
| *H01L 27/11556* | (2017.01) |
| *H01L 23/522* | (2006.01) |
| *H01L 23/528* | (2006.01) |
| *H01L 23/00* | (2006.01) |
| *H01L 27/11526* | (2017.01) |
| *H01L 25/18* | (2023.01) |
| *H01L 27/11573* | (2017.01) |

(52) U.S. Cl.
CPC .... *H01L 27/11582* (2013.01); *H01L 23/5226* (2013.01); *H01L 23/5283* (2013.01); *H01L 27/11556* (2013.01); *H01L 24/05* (2013.01); *H01L 24/08* (2013.01); *H01L 25/18* (2013.01); *H01L 27/11526* (2013.01); *H01L 27/11573* (2013.01); *H01L 2224/0557* (2013.01); *H01L 2224/08147* (2013.01); *H01L 2924/1431* (2013.01); *H01L 2924/14511* (2013.01)

(58) Field of Classification Search
CPC ............. H01L 23/5226; H01L 23/5283; H01L 27/11573; H01L 21/76804; H01L 21/76885; H01L 21/76897
See application file for complete search history.

(56) References Cited

U.S. PATENT DOCUMENTS

| | | | |
|---|---|---|---|
| 7,880,303 B2 | 2/2011 | Yu et al. | |
| 10,090,315 B2 | 10/2018 | Fukuzumi et al. | |
| 10,686,122 B2 | 6/2020 | Park et al. | |
| 10,727,215 B1* | 7/2020 | Zhang | ..................... H01L 24/08 |
| 11,139,246 B2 | 10/2021 | Kitamura et al. | |
| 2015/0076708 A1* | 3/2015 | Kaneko | ................. H01L 21/764 |
| | | | 257/774 |
| 2018/0090511 A1* | 3/2018 | Nakajima | ........... H01L 23/5226 |
| 2019/0051599 A1* | 2/2019 | Zhang | ............... H01L 27/11536 |
| 2019/0378852 A1* | 12/2019 | Baek | ................. H01L 29/40114 |
| 2020/0303308 A1 | 9/2020 | Kitamura et al. | |

FOREIGN PATENT DOCUMENTS

| | | |
|---|---|---|
| CN | 109755269 A | 5/2019 |
| JP | 2016-062901 A | 4/2016 |
| JP | 2020-155490 A | 9/2020 |

* cited by examiner

*Primary Examiner* — Sarah K Salerno
(74) *Attorney, Agent, or Firm* — Foley & Lardner LLP

(57) ABSTRACT

According to one embodiment, a semiconductor memory device includes a via provided above a substrate, a conductive layer provided on the via, and a via provided on the conductive layer. The via, the conductive layer, and the via are one continuous structure.

20 Claims, 17 Drawing Sheets

SEMICONDUCTOR MEMORY DEVICE

CROSS-REFERENCE TO RELATED APPLICATION(S)

This application claims the benefit of and priority to Japanese Patent Application No. 2019-168666, filed on Sep. 17, 2019, the entire contents of which are incorporated herein by reference.

FIELD

Embodiments described herein relate generally to a semiconductor memory device.

BACKGROUND

A semiconductor memory device in which memory cells are three-dimensionally arranged is known.

DETAILED DESCRIPTION

Figure 1:
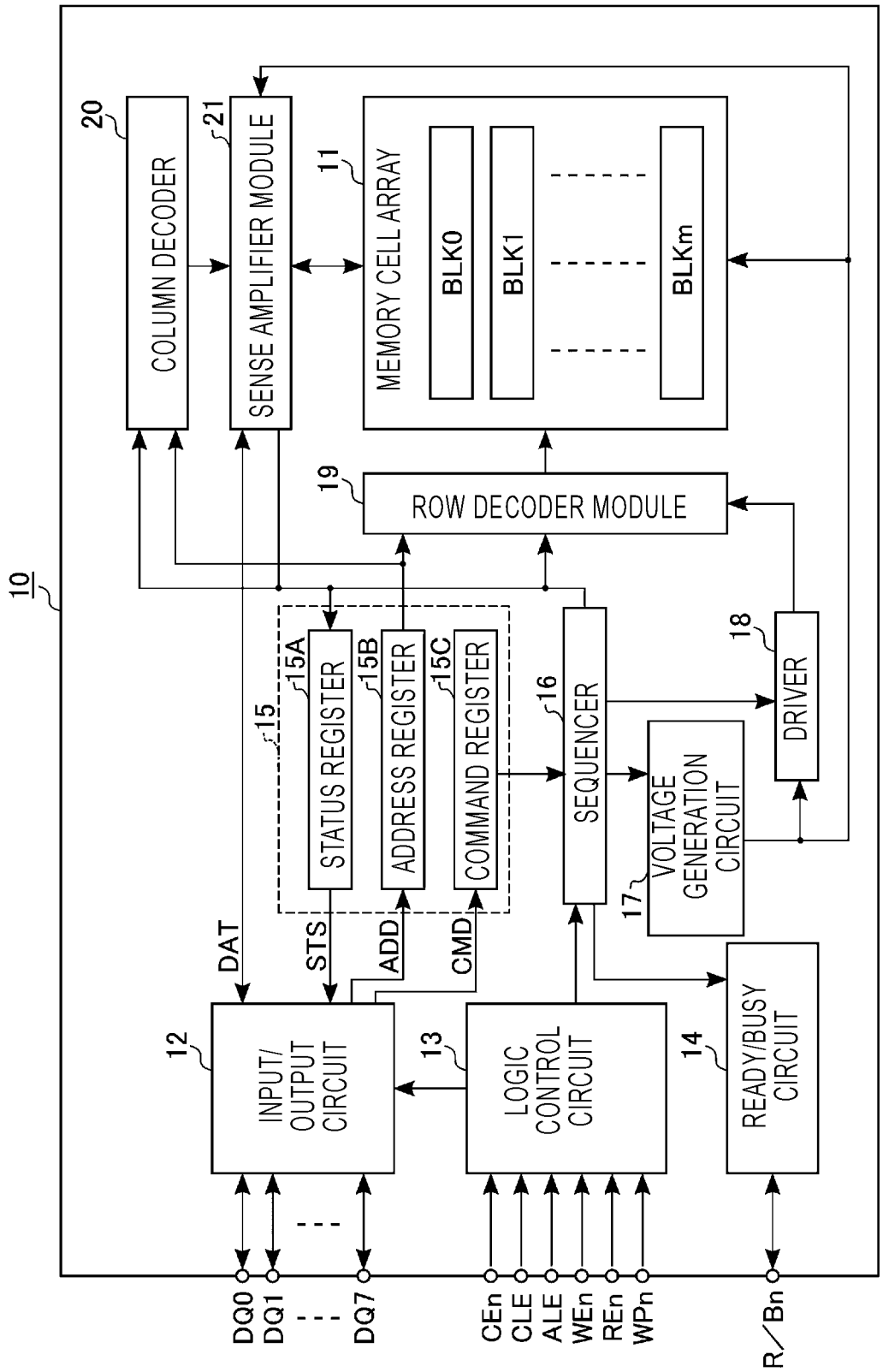
FIG. 1 is a block diagram illustrating a circuit configuration of a semiconductor memory device of a first embodiment.

The size of a semiconductor memory device may be reduced, and the operation reliability in the semiconductor memory device may be further improved.

In general, according to one embodiment, a semiconductor memory device may include a first contact plug provided above a substrate, a first conductive layer provided on the first contact plug, and a second contact plug provided on the first conductive layer, and the first contact plug, the first conductive layer, and the second contact plug are one continuous layer.

Hereinafter, embodiments will be described with reference to the drawings. In the following description, components having the same functions and configurations will be denoted by common reference numerals. Further, each embodiment to be described below describes an example of an apparatus or a method for embodying the technical idea of the embodiment, and materials, shapes, structures, arrangements, etc., of components may not be specified by those described herein below.

Here, a three-dimensionally stacked NAND-type flash memory in which memory cell transistors are stacked above a semiconductor substrate will be described as an example of the semiconductor memory device. Herein, a memory cell transistor may be referred to as a memory cell.

1. First Embodiment

Hereinafter, a semiconductor memory device of a first embodiment will be described. In the first embodiment, a via, a conductive layer (e.g., a bit line), and a via which are provided in this order on a memory pillar including memory cells will be described as an example. First, a circuit configuration of the semiconductor memory device will described, and then, the structure of the semiconductor memory device will be described.

1.1 Circuit Configuration of Semiconductor Memory Device

A circuit block configuration of the semiconductor memory device of the first embodiment will be described by using FIG. 1. FIG. 1 is a block diagram illustrating a circuit configuration of the semiconductor memory device of the first embodiment.

A semiconductor memory device 10 includes a memory cell array 11, an input/output circuit 12, a logic control circuit 13, a Ready/Busy circuit 14, a register group 15, a sequencer (or a control circuit) 16, a voltage generation circuit 17, a driver 18, a row decoder module (RD) 19, a column decoder 20, and a sense amplifier module 21. The register group 15 includes a status register 15A, an address register 15B, and a command register 15C.

The memory cell array 11 includes one or more blocks BLK0, BLK1, BLK2, ..., BLKm (m is an integer of more than or equal to 0). Each of the plurality of blocks BLK may include a plurality of memory cell transistors associated with rows and columns. The memory cell transistor may be an electrically rewritable non-volatile memory cell. In the memory cell array 11, a plurality of word lines, a plurality of bit lines, a source line, etc., may be arranged in order to control a voltage applied to the memory cell transistor. Hereinafter, a block BLK indicates each of the blocks BLK0 to BLKm. A specific configuration of the block BLK will be described later.

The input/output circuit 12 and the logic control circuit 13 may be connected to an external device (e.g., a memory controller) (not illustrated) via a bus. The input/output circuit 12 transmits/receives signals DQ (e.g., DQ0, DQ1, DQ2, ..., DQ7) to/from the memory controller via the bus.

The logic control circuit 13 may receive an external control signal from the memory controller via the bus. The external control signal includes, for example, a chip enable signal CEn, a command latch enable signal CLE, an address latch enable signal ALE, a write enable signal WEn, a read enable signal REn, and a write protect signal WPn. The "n" appended to a signal name indicates that the signal is active low.

The chip enable signal CEn may enable selection of the semiconductor memory device (NAND-type flash memory) 10, and may be asserted when the semiconductor memory device 10 is selected. The command latch enable signal CLE may make it possible to latch a command transmitted as the signal DQ into the command register 15C. The address latch enable signal ALE may make it possible to latch an address transmitted as the signal DQ into the address register 15B. The write enable signal WEn may make it possible to store data transmitted as the signal DQ in the input/output circuit 12. The read enable signal REn may make it possible to output data read from the memory cell array 11, as the signal DQ. The write protect signal WPn may be asserted when writing and erasing with respect to the semiconductor memory device 10 are prohibited.

The Ready/Busy circuit 14 may generate a Ready/Busy signal R/Bn according to a control from the sequencer 16. The signal R/Bn indicates whether the semiconductor memory device 10 is in a Ready state or a Busy state. The Ready state indicates a state where the semiconductor memory device 10 is able to receive a command from the memory controller. The Busy state indicates a state where the semiconductor memory device 10 is unable to receive a command from the memory controller. The memory controller may grasp whether the semiconductor memory device 10 is in the Ready state or the Busy state, by receiving the signal R/Bn from the semiconductor memory device 10.

The status register 15A may store status information STS required for the operation of the semiconductor memory device 10, and may transmit the status information STS to the input/output circuit 12 on the basis of an instruction of the sequencer 16. The address register 15B may store address information ADD transmitted from the input/output circuit 12. The address information ADD may include a column address and a row address. The row address may include, for example, a block address that designates a block BLK as an operation target, and a page address that designates a word line as an operation target in the designated block. The command register 15C may store a command CMD transmitted from the input/output circuit 12. The command CMD may include, for example, a write command and a read command which instruct the sequencer 16 to perform a write operation and a read operation, respectively. The status register 15A, the address register 15B, and the command register 15C may be composed of, for example, SRAMs (static random access memory chips).

The sequencer 16 may receive a command from the command register 15C, and may comprehensively control the semiconductor memory device 10 according to a sequence based on the command. The sequencer 16 may execute a write operation, a read operation, and an erase operation by controlling the row decoder module 19, the sense amplifier module 21, the voltage generation circuit 17, etc.

Specifically, the sequencer 16 may control the row decoder module 19, the driver 18, and the sense amplifier module 21 on the basis of a write command received from the command register 15C, so as to write data to a plurality of memory cell transistors designated by address information ADD. Further, the sequencer 16 may control the row decoder module 19, the driver 18, and the sense amplifier module 21 on the basis of a read command received from the command register 15C, so as to read data from a plurality of memory cell transistors designated by address information ADD.

The voltage generation circuit 17 may receive a power supply voltage from the outside of the semiconductor memory device 10, and generate a plurality of voltages required for a write operation, a read operation, and an erase operation by using the power supply voltage. The voltage generation circuit 17 may supply the generated voltages to the memory cell array 11, the driver 18, the sense amplifier module 21, etc.

The driver 18 may receive a plurality of voltages from the voltage generation circuit 17. Among the plurality of voltages supplied from the voltage generation circuit 17, the driver 18 may supply a plurality of voltages selected according to a read operation, a write operation, and an erase operation, to the row decoder module 19 via a plurality of signal lines.

The row decoder module 19 may receive a row address from the address register 15B, and decode the row address. On the basis of the decoding result of the row address, the row decoder module 19 may select one of the blocks BLK, and further select a word line in the selected block BLK. Further, the row decoder module 19 may transmit a plurality of voltages supplied from the driver 18, to the selected block BLK.

The column decoder 20 may receive a column address from the address register 15B, and decode the column address. The column decoder 20 may select a bit line on the basis of the decoding result of the column address.

The sense amplifier module 21 may detect and amplifies data read from a memory cell transistor to a bit line during a read operation of data. Then, the sense amplifier module 21 may temporarily store read data DAT read from the memory cell transistor, and transmit the data to the input/output circuit 12. Further, the sense amplifier module 21 may temporarily store write data DAT transmitted from the input/output circuit 12 during a write operation of data. Further, the sense amplifier module 21 may transmit the write data DAT to a bit line.

Next, a circuit configuration of the memory cell array 11 will be described by using FIG. 2. As described above, the memory cell array 11 includes the plurality of blocks BLK0 to BLKm. Here, a circuit configuration of one block BLK will be described, while circuit configurations of other blocks are the same.

Figure 2:
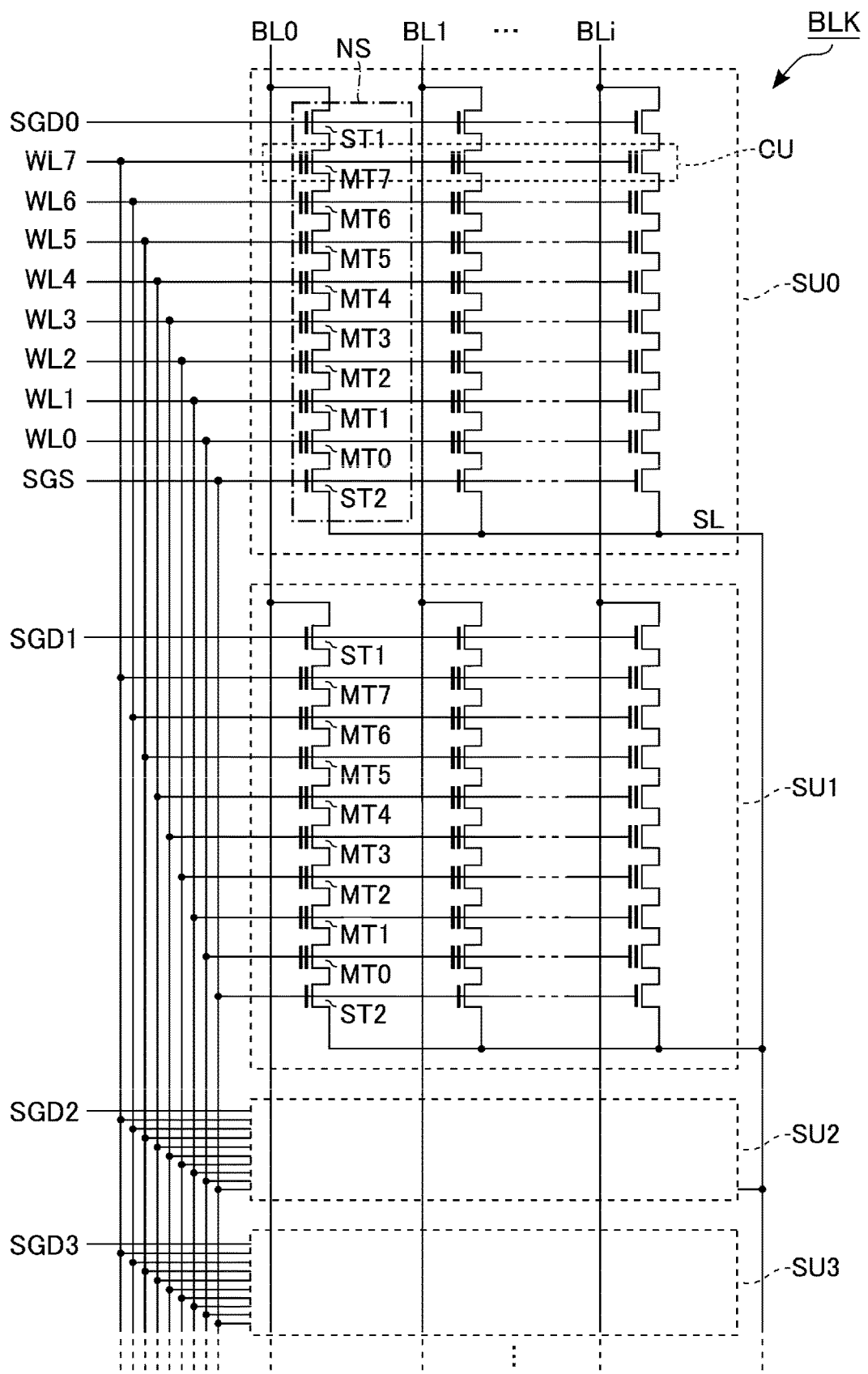
FIG. 2 is a circuit diagram of a block in a memory cell array in the first embodiment.

FIG. 2 is a circuit diagram of one block BLK in the memory cell array 11. The block BLK includes, for example, a plurality of string units SU0, SU1, SU2, and SU3. Here, as an example, an example in which the block BLK includes the string units SU0 to SU3 is illustrated, while the number of string units in the block BLK may be set as desired. Hereinafter, a string unit SU indicates each of the string units SU0 to SU3.

Each of the string units SU0 to SU3 includes a plurality of NAND strings (or memory strings) NS. The number of NAND strings NS in one string unit SU may be set as desired.

The NAND string NS includes a plurality of memory cell transistors MT0, MT1, MT2, . . . , MT7, and select transistors ST1 and ST2. Here, for the simplification of description, an example in which the NAND string NS includes eight memory cell transistors MT0 to MT7, and two select transistors ST1 and ST2 is illustrated, while the number of the memory cell transistors and the select transistors in the NAND string NS may be set as desired. Hereinafter, a memory cell transistor MT indicates each of the memory cell transistors MT0 to MT7.

Each of the memory cell transistors MT0 to MT7 may include a control gate and a charge storage layer, and store data in a non-volatile manner. The memory cell transistors MT0 to MT7 are connected in series between a source of the select transistor ST1 and a drain of the select transistor ST2.

In some implementations, the memory cell transistor MT is capable of storing 1-bit data, or data of 2 or more bits. The memory cell transistor MT may be a metal-oxide-nitride-oxide-silicon (MONOS) type transistor using an insulating film as a charge storage layer, or a floating gate (FG) type transistor using a conductive layer as a charge storage layer.

Gates of a plurality of select transistors ST1 in the string unit SU0 are connected to a select gate line SGD0. Similarly, gates of select transistors ST1 in the string units SU1 to SU3 are connected to the select gate lines SGD1 to SGD3, respectively. Each of the select gate lines SGD0 to SGD3 is independently controlled by the row decoder module 19.

Gates of a plurality of select transistors ST2 in the string unit SU0 are connected to a select gate line SGS. Similarly, gates of select transistors ST2 of each of the string units SU1 to SU3 are connected to the select gate line SGS. Also, there is a case where the gates of the select transistors ST2 of the string units SU0 to SU3 in the block BLK are connected to individual select gate lines SGS, that is, select gate lines SGS0 to SGS3, respectively. The select transistors ST1 and ST2 may be used for selection of the string unit SU in various operations.

Control gates of memory cell transistors MT0 to MT7 in the block BLK are connected to word lines WL0 to WL7, respectively. Each of the word lines WL0 to WL7 is independently controlled by the row decoder module 19.

Each of bit lines BL0 to BLi (i is an integer of more than or equal to 0) is connected to the plurality of blocks BLK, and is connected to one NAND string NS in the string unit SU in the block BLK. That is, each of the bit lines BL0 to BLi is connected to drains of select transistors ST1 of a plurality of NAND strings NS in the same column, among NAND strings NS arranged in a matrix form in the block BLK. In addition, a source line SL is connected to the plurality of blocks BLK. That is, the source line SL is connected to sources of the plurality of select transistors ST2 in the block BLK.

In sum, the string unit SU includes a plurality of NAND strings NS which are connected to different bit lines BL, and connected to the same select gate line SGD. Further, the block BLK includes the plurality of string units SU sharing the word lines WL. Also, the memory cell array 11 includes the plurality of blocks BLK sharing the bit lines BL.

The block BLK may be, for example, a data erasing unit. That is, data stored in the memory cell transistors MT in the same block BLK may be collectively erased. In addition, data may be erased in the unit of string unit SU or in the unit smaller than the string unit SU.

The plurality of memory cell transistors MT sharing a word line WL in one string unit SU is called a cell unit CU. A collection of respective 1-bit data pieces stored in the plurality of memory cell transistors MT in the cell unit CU is called a page. The storage capacity of the cell unit CU may change according to the number of bits of data stored in the memory cell transistor MT. For example, when each memory cell transistor MT may store 1-bit data, 2-bit data, and 3-bit data, the cell unit CU stores one page data, two page data, and three page data, respectively.

A write operation and a read operation for the cell unit CU may be performed in the unit of page. That is, the read and write operations may be collectively performed for the plurality of memory cell transistors MT connected to one word line WL arranged in one string unit SU.

In addition, as the configuration of the memory cell array 11, other configurations may be employed. For example, the configuration of the memory cell array 11 is described in U.S. patent application Ser. No. 12/407,403 filed on Mar. 19, 2009 and titled "THREE DIMENSIONAL STACKED NONVOLATILE SEMICONDUCTOR MEMORY." Also, the configuration is described in U.S. patent application Ser. No. 12/406,524 filed on Mar. 18, 2009 and titled "THREE DIMENSIONAL STACKED NONVOLATILE SEMICONDUCTOR MEMORY," U.S. patent application Ser. No. 12/679,991 filed on Mar. 25, 2010 and titled "NON-VOLATILE SEMICONDUCTOR STORAGE DEVICE AND METHOD OF MANUFACTURING THE SAME," and U.S. patent application Ser. No. 12/532,030 filed on Mar. 23, 2009 and titled "SEMICONDUCTOR MEMORY AND METHOD FOR MANUFACTURING SAME." These patent applications are incorporated in the descriptions herein below by reference in their entireties.

1.2 Structure of Semiconductor Memory Device

Figure 3:
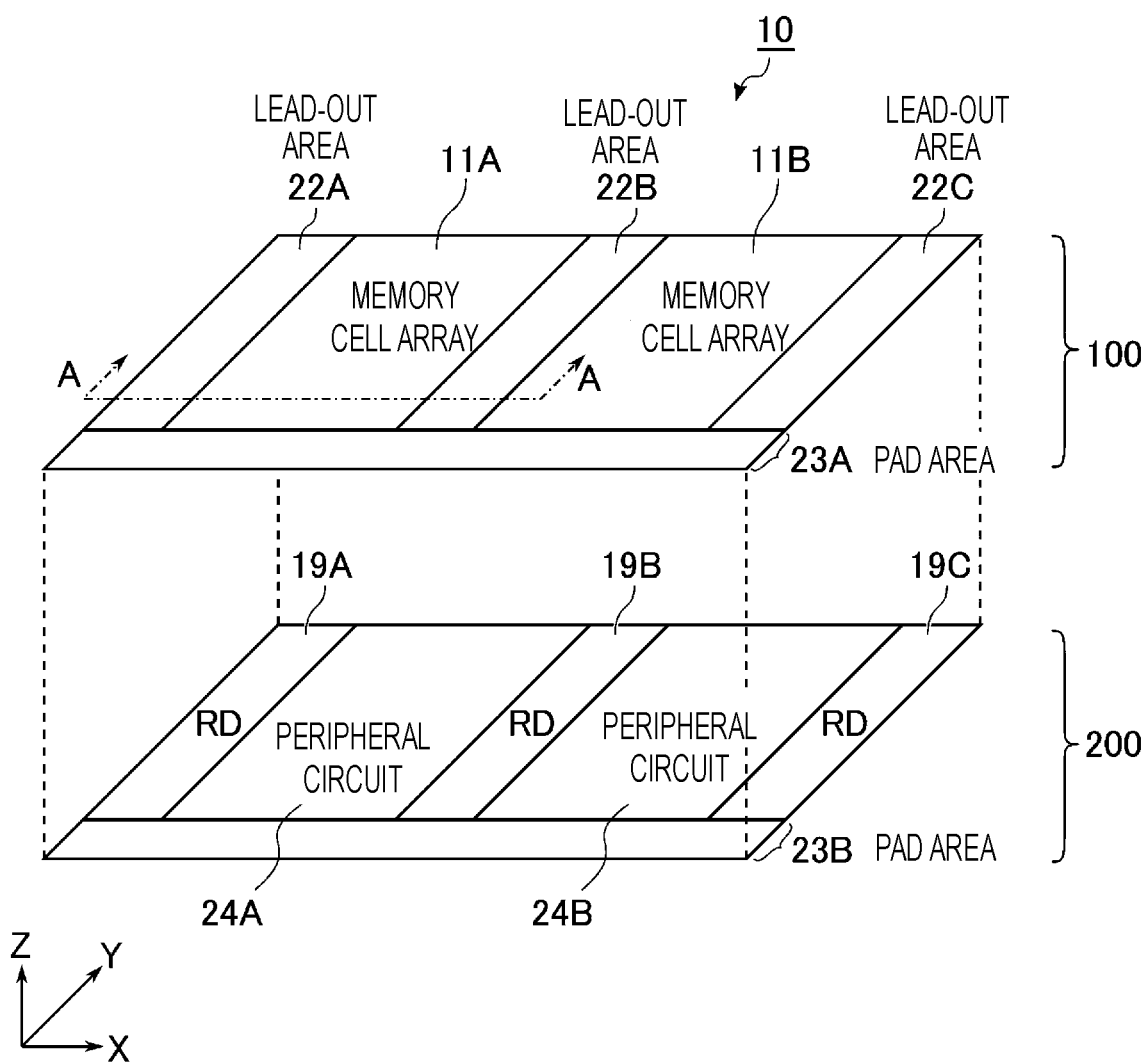
FIG. 3 is a view illustrating an example of a planar layout of the semiconductor memory device of the first embodiment.

Next, an example of a structure of the semiconductor memory device of the first embodiment will be described. First, an example of a planar layout of the semiconductor memory device 10 will be described by using FIG. 3. FIG. 3 is a view illustrating an example of the planar layout of the semiconductor memory device of the first embodiment. In FIG. 3 and the subsequent drawings, two directions parallel to a semiconductor substrate surface (or a wafer surface) and perpendicular to (or intersecting) each other are set as an X direction and a Y direction, and a direction perpendicular to (or intersecting) the plane (XY plane) including the X direction and the Y direction is set as a Z direction. The X direction corresponds to the extension direction of a word line WL, the Y direction corresponds to the extension direction of a bit line BL, and the Z direction corresponds to a direction perpendicular to the semiconductor substrate surface of the semiconductor memory device 10.

As illustrated in FIG. 3, the semiconductor memory device 10 includes, for example, a memory array chip 100 and a peripheral circuit chip 200.

The memory array chip 100 includes memory cell arrays 11A and 11B, lead-out areas 22A, 22B, and 22C, and a pad area 23A. The memory cell arrays 11A and 11B constitute the memory cell array 11. The peripheral circuit chip 200 may manage a communication with the memory controller (not illustrated) provided outside, and includes peripheral circuits 24A and 24B, row decoder modules (RD) 19A, 19B, and 19C, and a pad area 23B. The row decoder modules 19A to 19C constitute the row decoder module 19. The peripheral circuits 24A and 24B and the row decoder modules 19A to 19C may control the memory array chip 100.

The memory array chip 100 and the peripheral circuit chip 200 may be formed by different semiconductor substrates, respectively. Electrode pads on the surface of the memory array chip 100 and electrode pads on the surface of the peripheral circuit chip 200 may be disposed to face each other, and the electrode pads of the memory array chip 100 may be bonded to the electrode pads of the peripheral circuit chip 200. Accordingly, one semiconductor memory device (semiconductor memory) 10 may be formed.

In the memory array chip 100, the memory cell arrays 11A and 11B are capable of executing different operations in parallel. The memory cell arrays 11A and 11B are disposed between the lead-out areas 22A, 22B and 22C arranged in the X direction. Specifically, the memory cell array 11A is disposed between the lead-out areas 22A and 22B, and the memory cell array 11B is disposed between the lead-out areas 22B and 22C.

The lead-out areas 22A and 22B are areas for electrically connecting the memory cell array 11A provided in the memory array chip 100 to the row decoder modules 19A and 19B provided in the peripheral circuit chip 200. The lead-out areas 22B and 22C are areas for electrically connecting the memory cell array 11B provided in the memory array chip 100 to the row decoder modules 19B and 19C provided in the peripheral circuit chip 200.

The pad area 23A is an area where a pad used for a connection between the peripheral circuit chip 200 and the memory controller is provided. The pad area 23A extends in the X direction, and is provided adjacent to the memory cell arrays 11A and 11B.

In the peripheral circuit chip 200, the row decoder modules 19A, 19B, and 19C are provided to overlap with or face the lead-out areas 22A, 22B, and 22C of the memory array chip 100, respectively. For example, the row decoder modules 19A and 19B may be electrically connected to word lines WL provided in the memory cell array 11A, and the row decoder modules 19B and 19C may be electrically connected to word lines WL provided in the memory cell array 11B.

The peripheral circuit 24A is provided between, for example, the row decoder modules 19A and 19B, and the peripheral circuit 24B is provided between, for example, the row decoder modules 19B and 19C. The peripheral circuits include, for example, the input/output circuit 12, the logic control circuit 13, the Ready/Busy circuit 14, the register group 15, the sequencer 16, the voltage generation circuit 17, the driver 18, the column decoder 20, the sense amplifier module 21, etc.

The pad area 23B is provided adjacent to the peripheral circuits 24A and 24B, and overlapping with the pad area 23A of the memory array chip 100. In the pad area 23B, for example, wirings drawn from input/output circuits in the peripheral circuits 24A and 24B, etc., are disposed. These wirings may be pulled out to the top surface of the semiconductor memory device 10 by vias and pads.

Next, a cross-sectional structure of the semiconductor memory device 10 will be described by using FIG. 4. In cross-sectional views of FIG. 4 and the subsequent drawings, the arrow direction in the Z direction is referred to as a positive direction, and the opposite direction to the arrow direction in the Z direction is referred to as a negative direction. Further, in the following description, "upper" and "lower" correspond to directions in each drawing. Also, in FIG. 4, interlayer insulating films between conductive layers are omitted.

Figure 4:
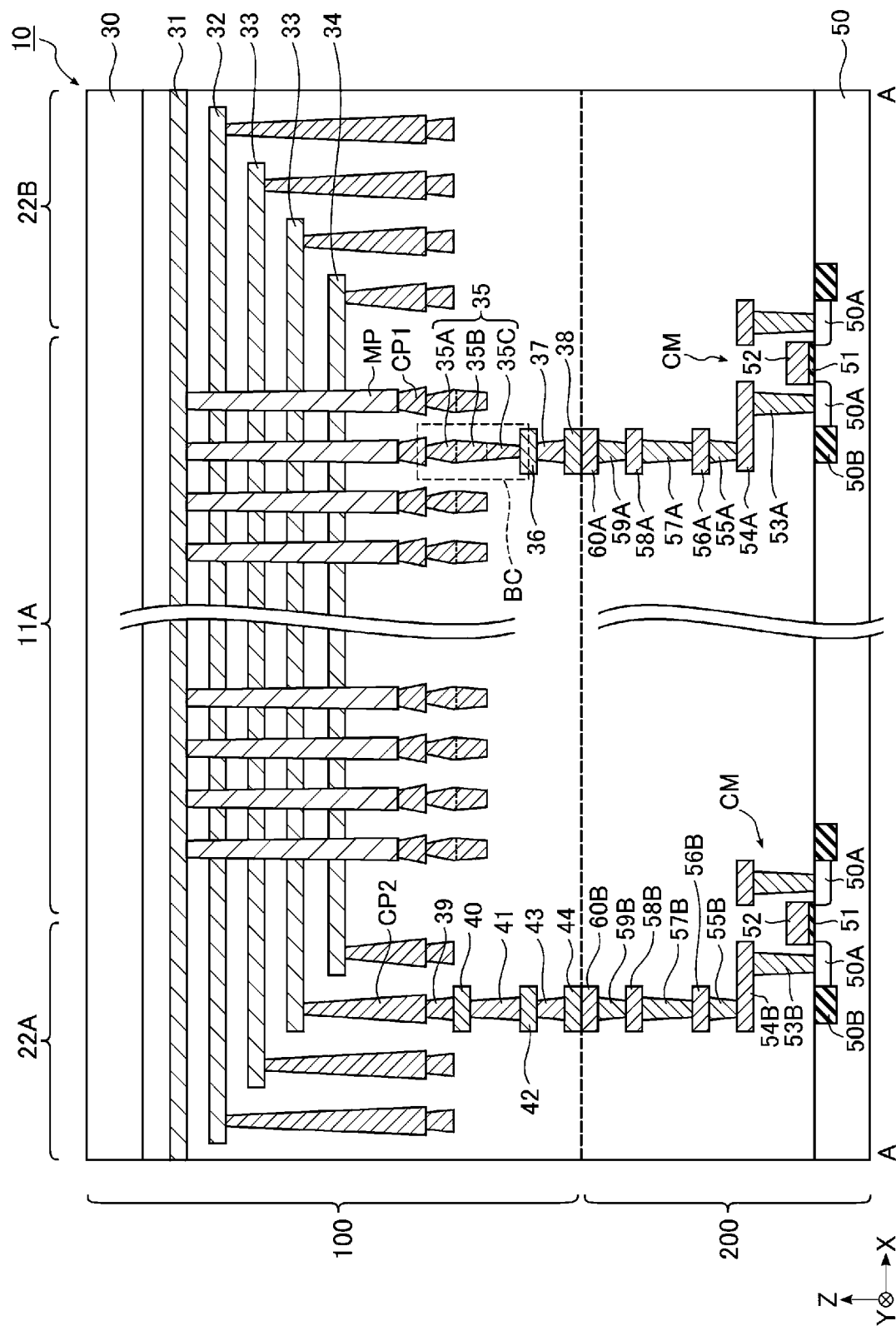
FIG. 4 is a cross-sectional view taken along the A-A line in FIG. 3.

FIG. 4 is a cross-sectional view taken along the A-A line of FIG. 3, and a cross-sectional view taken along the XZ plane of the memory cell array 11A, the lead-out areas 22A and 22B, the peripheral circuit 24A, and the row decoder modules 19A and 19B.

As described above, the semiconductor memory device 10 has a structure in which the memory array chip 100 is bonded to the peripheral circuit chip 200.

Hereinafter, a cross-sectional structure in the memory array chip 100 will be described in detail.

On a semiconductor substrate 30, a conductive layer 31 is provided via an insulating layer in the negative Z direction. On the conductive layer 31, a stacked body in which a conductive layer 32, a plurality of conductive layers 33, and a conductive layer 34 are stacked is provided via insulating layers in the negative Z direction. The conductive layers 31 to 34 extend in the X direction. Each of the conductive layers 31 to 34 has a plate shape along (or parallel to) the XY plane (or the surface of the semiconductor substrate 30).

The conductive layer 31 may function as the source line SL. The conductive layer 32 may function as the select gate line SGS. The conductive layers 33 function as the plurality of word lines WL0 to WL7, respectively. In FIG. 4, two conductive layers 33 are illustrated, and other conductive layers 33 are omitted. The conductive layer 34 may function as the select gate line SGD. The conductive layers 31 to 34 may contain, for example, tungsten (W) or polycrystalline silicon. The semiconductor substrate 30 may include, for example, a silicon substrate and a silicon epitaxial layer.

In the stacked body including the conductive layers 32 to 34, a plurality of columnar memory pillars MP is provided. Each memory pillar MP extends in the Z direction. Each memory pillar MP is disposed to penetrate the conductive layers 32 to 34 in the Z direction (or the stacking direction), and reaches the conductive layer 31 from the surface of the conductive layer 34. That is, the memory pillar MP is connected to the source line SL through the select gate line SGD, the plurality of word lines WL0 to WL7, and the select gate line SGS.

A contact plug CP1 is provided in the negative Z direction on the memory pillar MP, and a conductive layer 35 is provided on the contact plug CP1. On the conductive layer 35, a conductive layer 36, a via 37, and a conductive pad 38 are provided in this order in the negative Z direction. The conductive layer 35 includes a via (or a contact plug) 35A, a conductive layer 35B, and a via (or a contact plug) 35C. Details of the memory pillar MP and the conductive layer 35 will be described later.

The end portion of each of the conductive layers 32 to 34 extending in the X direction is electrically connected to a via 39 via a contact plug CP2. On the via 39, a conductive layer 40, a via 41, a conductive layer 42, a via 43, and a conductive pad 44 are provided in this order in the negative Z direction.

Hereinafter, a cross-sectional structure in the peripheral circuit chip 200 will be described in detail.

On a semiconductor substrate 50, for example, a CMOS circuit CM including an n-channel MOS field effect transistor (hereinafter, referred to as an nMOS transistor), and a p-channel MOS field effect transistor (hereinafter, referred to as a pMOS transistor) is provided. The CMOS circuits CM constitute the peripheral circuit 24A and the row decoder modules 19A and 19B that control operations of a plurality of memory cells. The semiconductor substrate 50 may include, for example, a silicon substrate and a silicon epitaxial layer.

As illustrated in FIG. 4, the semiconductor substrate 50 is provided with a source region 50A/a drain region 50A, and an element isolation area 50B. In the semiconductor substrate 50 between the source region 50A and the drain region 50A, a gate insulating layer 51 is provided in the positive Z direction, and a gate electrode 52 is provided on the gate insulating layer 51. Each of the nMOS transistor and the pMOS transistor includes the source region 50A, the drain region 50A, a semiconductor layer of the semiconductor substrate 50, the gate insulating layer 51, and the gate electrode 52.

A via 53A is provided in the positive Z direction in each of the source region 50A and the drain region 50A, and a conductive layer 54A is provided on each via 53A. On the conductive layer 54A, a via 55A, a conductive layer 56A, a via 57A, a conductive layer 58A, a via 59A, and a conductive pad 60A are provided in this order in the positive Z direction. The conductive pad 60A is disposed on the surface of the peripheral circuit chip 200 in the positive Z direction.

A via 53B is provided in the positive Z direction in each of the other source region 50A and the other drain region 50A, and a conductive layer 54B is provided on each via 53B. On the conductive layer 54B, a via 55B, a conductive layer 56B, a via 57B, a conductive layer 58B, a via 59B, and a conductive pad 60B are provided in this order in the positive Z direction. The conductive pad 60B is disposed on the surface of the peripheral circuit chip 200 in the positive Z direction.

The memory array chip 100 and the peripheral circuit chip 200 are bonded to each other such that, for example, conductive pads including the conductive pads 38 and 44 and conductive pads including the conductive pads 60A and 60B face each other. Accordingly, the conductive pad 38 and the conductive pad 60A are bonded and electrically connected to each other. Similarly, the conductive pad 44 and the conductive pad 60B are bonded and electrically connected to each other.

Next, another structure example of the semiconductor memory device of the first embodiment will be described. In the example illustrated in FIG. 4, although the semiconductor memory device 10 in which the memory array chip 100 is bonded to the peripheral circuit chip 200 is described as an example, the present disclosure is not limited thereto, and may also be applicable to a semiconductor memory device having another structure.

Figure 5:
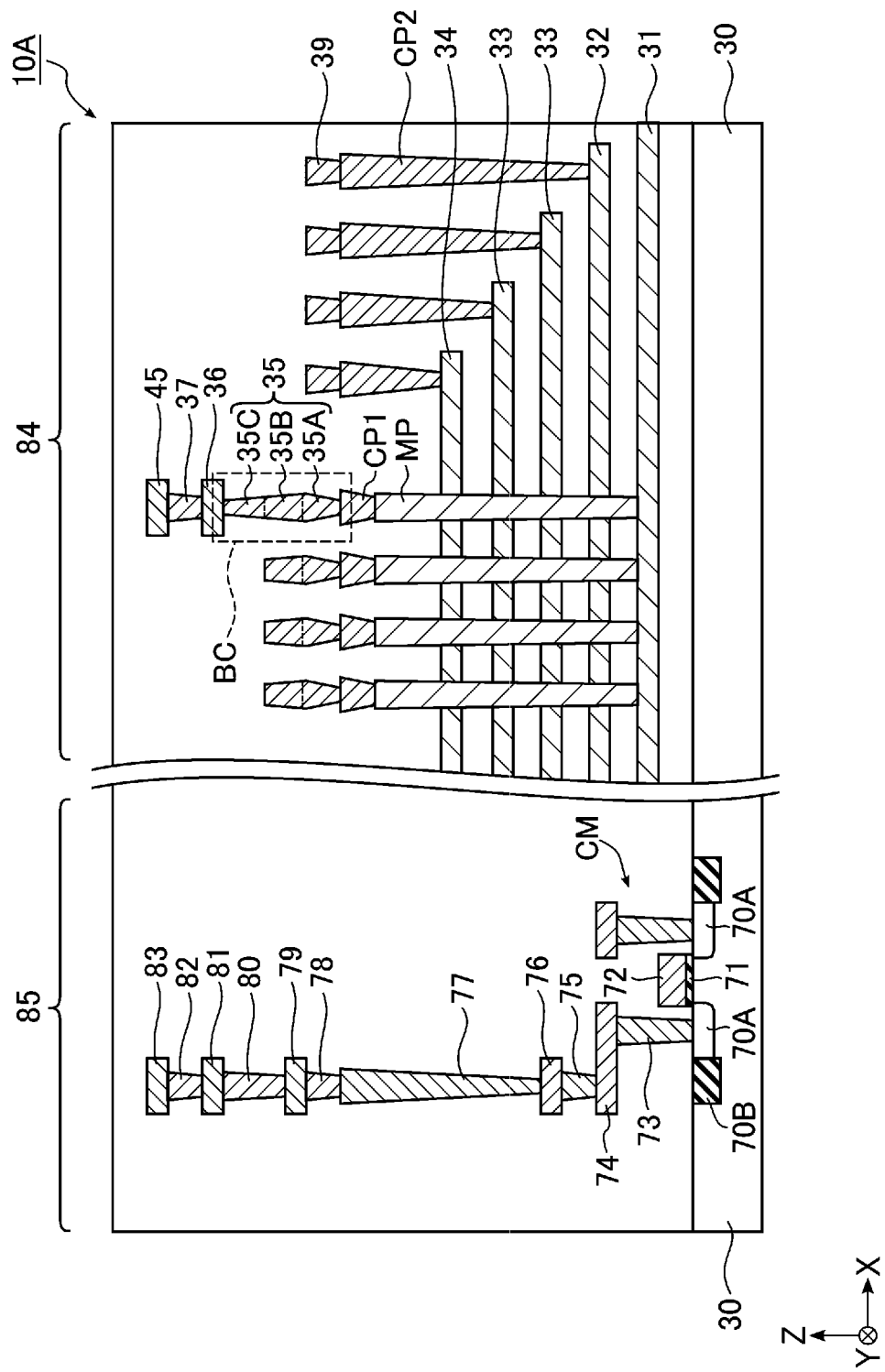
FIG. 5 is a cross-sectional view illustrating another structure example of the semiconductor memory device of the first embodiment.

FIG. 5 is a cross-sectional view illustrating another structure example of the semiconductor memory device of the first embodiment. For example, as illustrated in FIG. 5, the present disclosure may also be applicable to a semiconductor memory device 10A in which an area 84 where memory cells are formed and an area 85 where peripheral circuits are formed are provided on one semiconductor substrate 30. Further, in FIG. 5, interlayer insulating films between conductive layers are omitted.

The cross-sectional structure of the area 84 where the memory cells are formed is as follows.

The plurality of columnar memory pillars MP are provided in a stacked body including the conductive layers 32 to 34 on the semiconductor substrate 30. Each memory pillar MP extends in the Z direction, and is disposed to penetrate the conductive layers 32 to 34 in the Z direction.

The contact plug CP1 is provided in the positive Z direction on the memory pillar MP, and the conductive layer 35 is provided on the contact plug CP1. On the conductive layer 35, the conductive layer 36, the via 37, and a conductive layer 45 are provided in this order in the positive Z direction. Details of the memory pillar MP and the conductive layer 35 will be described later.

The cross-sectional structure of the area 85 where the peripheral circuits are formed is as follows.

On the semiconductor substrate 30, for example, a CMOS circuit CM including an nMOS transistor, and a pMOS transistor is provided. The semiconductor substrate 30 is provided with a source region 70A/a drain region 70A, and an element isolation area 70B. In the semiconductor substrate 30 between the source region 70A and the drain region 70A, a gate insulating layer 71 is provided in the positive Z direction, and a gate electrode 72 is provided on the gate insulating layer 71. Each of the nMOS transistor and the pMOS transistor includes the source region 70A, the drain region 70A, the semiconductor layer of the semiconductor substrate 30, the gate insulating layer 71, and the gate electrode 72.

A via 73 is provided in the positive Z direction in each of the source region 70A and the drain region 70A, and a conductive layer 74 is provided on each via 73. On the conductive layer 74, a via 75, a conductive layer 76, a via 77, a via 78, a conductive layer 79, a via 80, a conductive layer 81, a via 82, and a conductive layer 83 are provided in this order in the positive Z direction.

Next, a cross-sectional structure of the memory pillar MP (or the NAND string NS) in the memory cell array 11 will be described by using FIG. 6. The memory pillar MP includes the memory cell transistors MT0 to MT7 and the select transistors ST1 and ST2.

Figure 6:
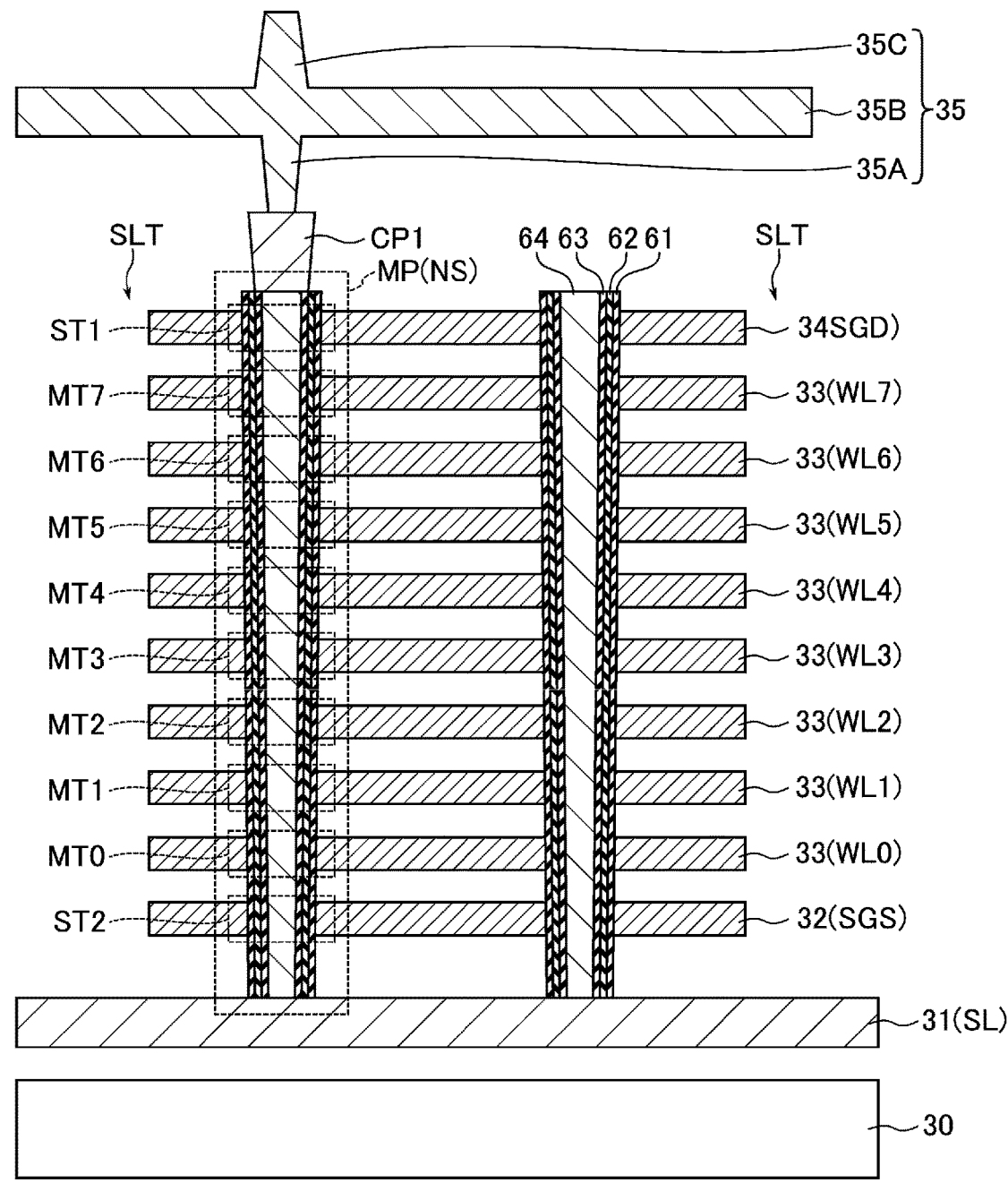
FIG. 6 is a cross-sectional view of a memory pillar in the memory cell array in the first embodiment.

FIG. 6 is a cross-sectional view of the memory pillar MP in the memory cell array 11 in the first embodiment. FIG. 6 illustrates a state where the memory pillar MP illustrated in FIG. 4 is rotated 180°, and a state where the memory pillar MP illustrated in FIG. 5 is not rotated. Further, in FIG. 6, interlayer insulating films between conductive layers are omitted.

As illustrated in FIG. 6, the memory cell array 11 includes the semiconductor substrate 30, the conductive layers 31 to 34, the memory pillars MP, the contact plug CP1, and the conductive layer 35. The conductive layer 31 is provided above the semiconductor substrate 30. The conductive layer 31 may be formed in a plate shape parallel to the XY plane, and may function as the source line SL. Further, the main surface of the semiconductor substrate 30 corresponds to the XY plane.

On the conductive layer 31, a plurality of slits SLT along the XZ plane are arranged in the Y direction. A structure (or a stacked body) on the conductive layer 31 between adjacent slits SLT may correspond to, for example, one string unit SU.

On the conductive layer 31 between the adjacent slits SLT, the conductive layer 32, the plurality of conductive layers 33, the conductive layer 34, and the conductive layer 35 are provided in this order from the lower layer. Among these conductive layers, conductive layers adjacent to each other in the Z direction may be stacked via the interlayer insulating films. Each of the conductive layers 32 to 34 is formed in a plate shape parallel to the XY plane. The conductive layer 32 may function as the select gate line SGS. The plurality of conductive layers 33 may function as the word lines WL0 to WL7, respectively, in an order from the lower layer. The conductive layer 34 may function as the select gate line SGD. The conductive layers 32 to 34 may contain, for example, tungsten (W).

The plurality of memory pillars MP may be arranged in, for example, staggered patterns in the X direction and the Y direction. Each of the plurality of memory pillars MP extends (or passes) through the inside of the stacked body between the slits SLT, in the Z direction. Each memory pillar MP is provided through the conductive layers 34, 33, and 32 to reach the top surface of the conductive layer 31 from the upper surface of the conductive layer 34. Each memory pillar MP may function as one NAND string NS.

The memory pillar MP includes, for example, a block insulating layer 61, a charge storage layer 62, a tunnel insulating layer (also called a tunnel insulating film) 63, and a semiconductor layer 64. Specifically, the block insulating layer 61 is provided on the inner wall of a memory hole for forming the memory pillar MP. The charge storage layer 62 is provided on the inner wall of the block insulating layer 61. The tunnel insulating layer 63 is provided on the inner wall of the charge storage layer 62. Further, the semiconductor layer 64 is provided inside the tunnel insulating layer 63. In addition, the memory pillar MP may have a structure in which a core insulating layer is provided inside the semiconductor layer 64.

In such a configuration of the memory pillar MP, a portion where the memory pillar MP and the conductive layer 32 intersect each other may function as the select transistor ST2. Portions where the memory pillar MP and the conductive layers 33 intersect each other may function as the memory cell transistors MT0 to MT7, respectively. Further, a portion where the memory pillar MP and the conductive layer 34 intersect each other may function as the select transistor ST1.

The semiconductor layer 64 may function as a channel layer of the memory cell transistors MT, and the select transistors ST1 and ST2. Inside the semiconductor layer 64, a current path of the NAND string NS is formed.

The charge storage layer 62 has a function of storing charges injected from the semiconductor layer 64, in the memory cell transistors MT. The charge storage layer 62 may include, for example, a silicon nitride film.

The tunnel insulating layer 63 may function as a potential barrier when charges are injected from the semiconductor layer 64 to the charge storage layer 62, or when charges stored in the charge storage layer 62 are diffused to the semiconductor layer 64. The tunnel insulating layer 63 may include, for example, a silicon oxide film.

The block insulating film 61 may prevent charges stored in the charge storage layer 62 from being diffused to the conductive layers 33 (the word lines WL). The block insulating layer 61 may include, for example, a silicon oxide layer and a silicon nitride layer.

Above the upper surface of the memory pillar MP, the conductive layer 35 including the via 35A, the conductive layer 35B, and the via 35C is provided via the interlayer insulating film. The conductive layer 35B is a line-shaped wiring layer extending in the Y direction, and may function as the bit line BL. The plurality of conductive layers 35 are arranged in the X direction, and the conductive layer 35 is electrically connected to one corresponding memory pillar MP in each string unit SU. Specifically, in each string unit SU, the contact plug CP1 is provided on the semiconductor layer 64 in each memory pillar MP, and one conductive layer 35 is provided on the contact plug CP1. The conductive layer 35 may contain, for example, copper (Cu), aluminum (Al), or tungsten (W). The contact plug CP1 may include a conductive layer, for example, tungsten (W).

Further, the numbers of the word lines WL, and the select gate lines SGD and SGS are not limited to the above-described numbers, and are changed according to the number of the memory cell transistors MT, and the number of the select transistors ST1 and ST2, respectively. The select gate line SGS may be composed of a plurality of conductive layers provided in a plurality of layers, respectively. The select gate line SGD may be composed of a plurality of conductive layers provided in a plurality of layers, respectively.

1.2.1 Structure of Conductive Layer 35 on Memory Pillar

An example of a structure of the conductive layer 35 illustrated in a region BC in FIGS. 4 and 5 will be described by using FIGS. 7 to 9. Each conductive layer 35 may be one layer including the via 35A, the conductive layer 35B (or the bit line BL), and the via 35C.

Figure 7:
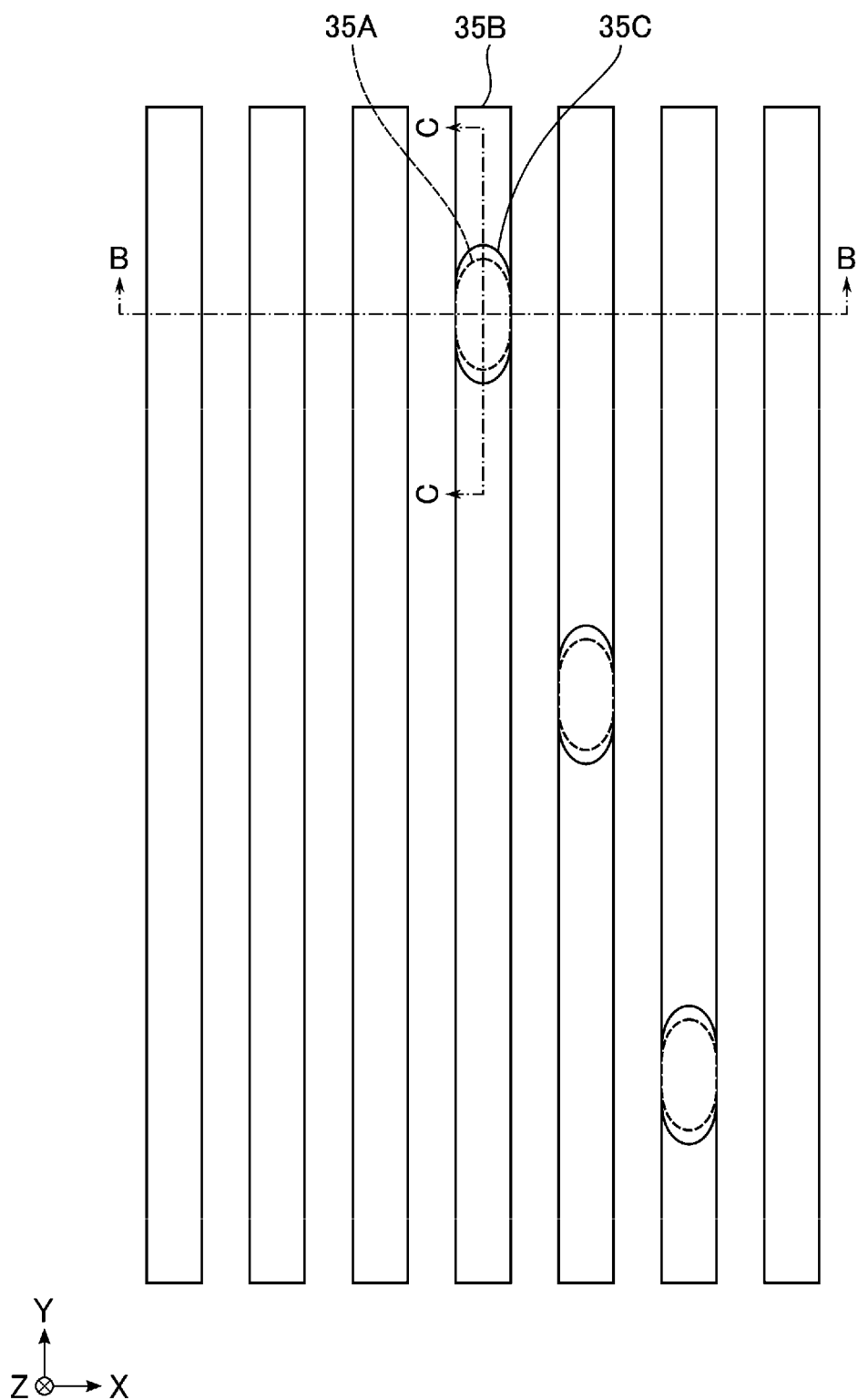
FIG. 7 is a plan view of vias and a conductive layer in the semiconductor memory device of the first embodiment.

FIG. 7 is a plan view of the via 35A, the conductive layer 35B, and the via 35C in the semiconductor memory device 10 of the first embodiment. FIG. 8 is a sectional view taken along the B-B line in FIG. 7, and illustrates a section of the via 35A, the conductive layer 35B, and the via 35C in the X direction. FIG. 9 is a cross-sectional view taken along the C-C line in FIG. 7, and illustrates a section of the via 35A, the conductive layer 35B, and the via 35C in the Y direction.

Figure 8:
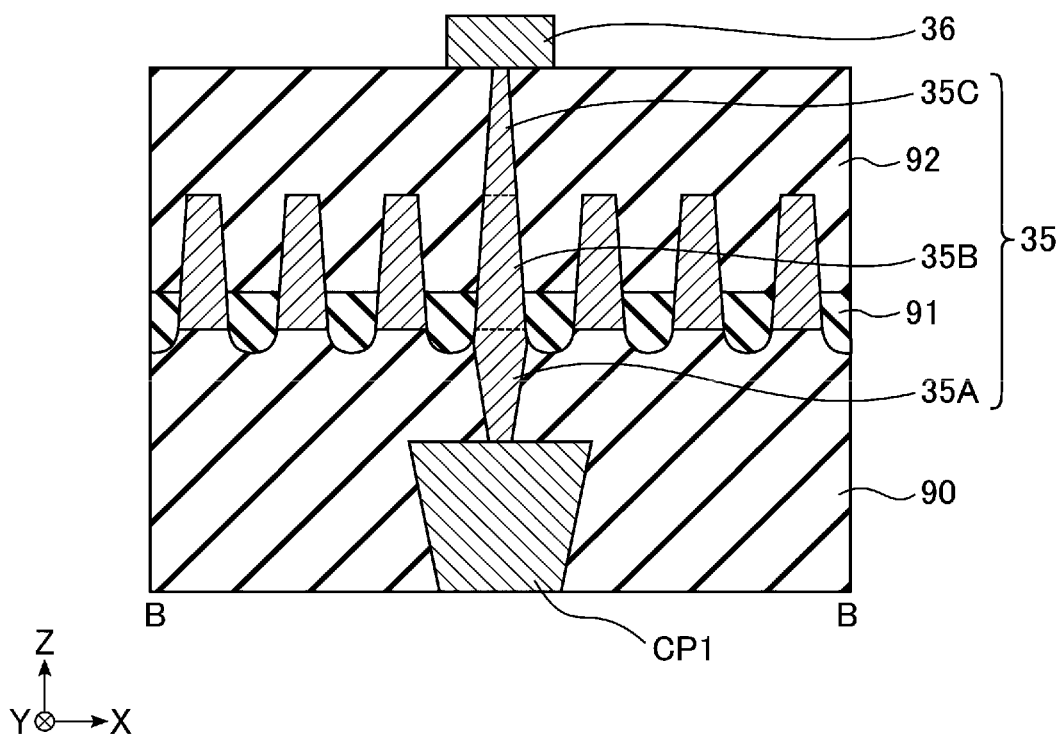
FIG. 8 is a cross-sectional view taken along the B-B line in FIG. 7.
Figure 9:
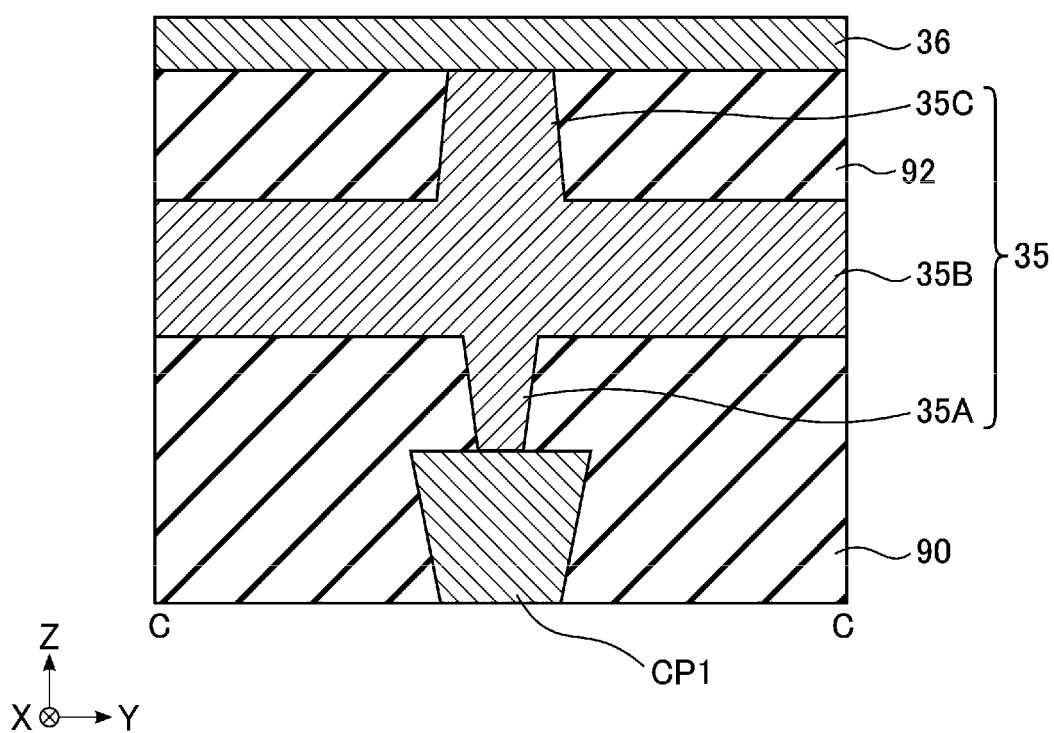
FIG. 9 is a cross-sectional view taken along the C-C line in FIG. 7.

As illustrated in FIGS. 7, 8, and 9, the plurality of conductive layers 35B extend in the Y direction. The conductive layers 35B extending in the Y direction are arranged in the X direction at predetermined intervals. In each of the conductive layers 35B, the via 35A and the via 35C are disposed in the Z direction. Each via 35A extends in the Z direction and is provided below each conductive layer 35B, or is provided on the semiconductor substrate 30 (or the contact plug CP1) side of each conductive layer 35B. Each via 35C extends in the Z direction, and is provided above each conductive layer 35B, or is provided on the conductive layer 36 side of each conductive layer 35B.

The via 35A is formed continuous to the conductive layer 35B. No boundary region is present between the via 35A and the conductive layer 35B. The via 35C is formed continuous to the conductive layer 35B. No boundary region is present between the via 35C and the conductive layer 35B. That is, the conductive layer 35B has the via 35A protruding downward, and the via 35C protruding upward.

Hereinafter, a structure of the via 35A, the conductive layer 35B and the via 35C will be described in detail by using FIGS. 8 and 9.

The contact plug CP1 is provided in an insulating layer 90. The via 35A is provided in the insulating layer 90 on the contact plug CP1. The conductive layers 35B are arranged at predetermined intervals in the X direction on the via 35A and on the insulating layer 90. An insulating layer 91 is provided between the conductive layers 35B on the insulating layer 90. An insulating layer 92 is provided on the insulating layer 91 and on the conductive layer 35B. The via 35C is provided in the insulating layer 92 on the conductive layer 35B. Further, the conductive layer 36 is provided on the via 35C.

In the X direction, a first width of the conductive layer 35B at a position close to (or connected to) the via 35A may be larger than a second width of the conductive layer 35B at a position farther from the via 35A than the position of the first width. The via 35A may have a columnar shape extending in the Z direction, and a first diameter of the via 35A at a position close to (or connected to) the conductive layer 35B may be larger than a second diameter of the via 35A at a position farther from the conductive layer 35B than the position of the first diameter. The via 35C may have a columnar shape extending in the Z direction, and a third diameter of the via 35C at a position close to (or connected to) the conductive layer 35B may be larger than a fourth diameter of the via 35C at a position farther from the conductive layer 35B than the position of the third diameter. In the X direction, the width of the conductive layer 35B may be larger than the diameter of the via 35C.

The via 35A, the conductive layer 35B, and the via 35C are continuously formed between the contact plug CP1 and the conductive layer 36. The via 35A, the conductive layer 35B and the via 35C may be electrically connected, and may electrically connect the contact plug CP1 and the conductive layer 36 to each other.

Figure 10:
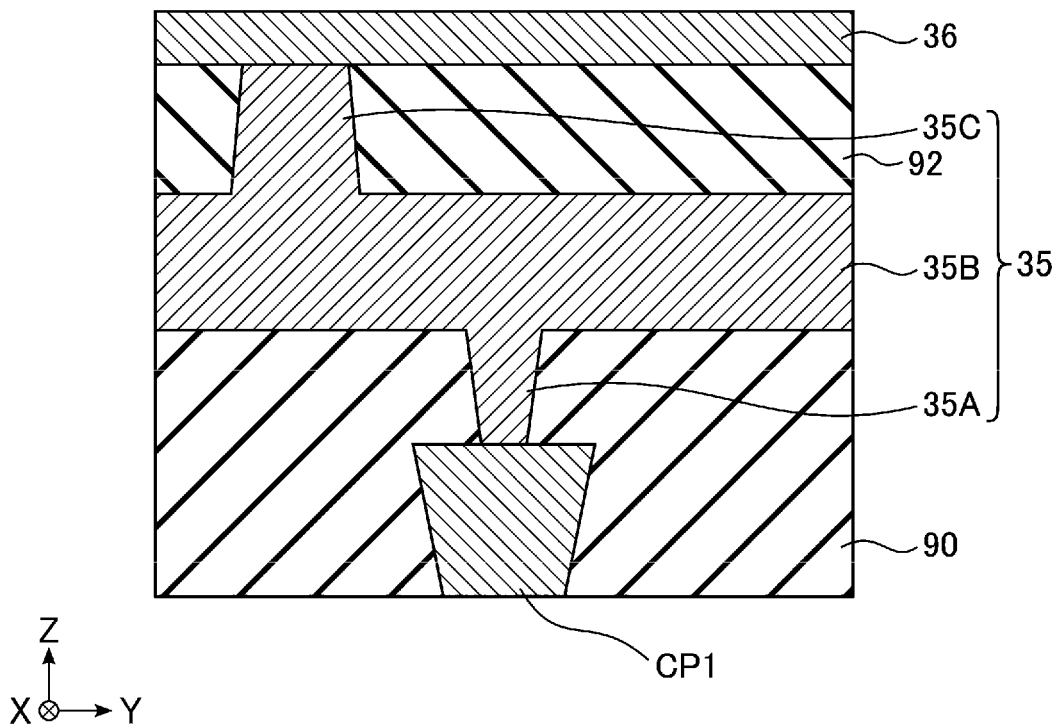
FIG. 10 is a cross-sectional view taken along the YZ plane in a modification of the vias and the conductive layer in the first embodiment.
Figure 11:
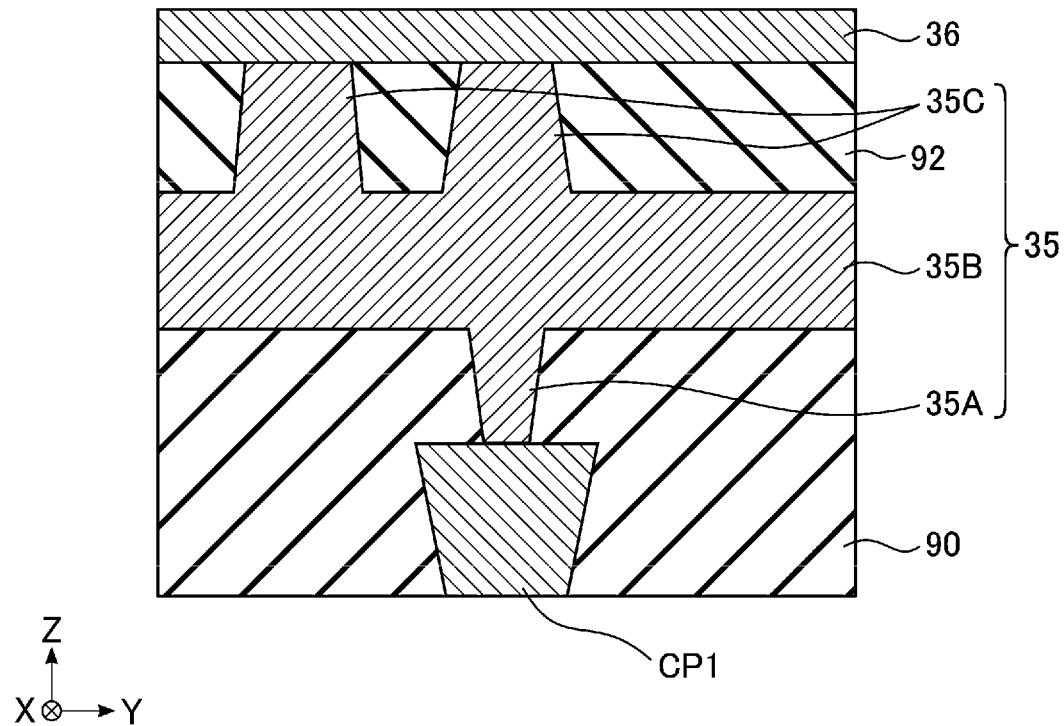
FIG. 11 is a cross-sectional view taken along the YZ plane in another modification of the vias and the conductive layer in the first embodiment.

Here, an example in which in the top view illustrated in FIG. 7, each of the via 35A and the via 35C is an oval or an ellipse having a long diameter in the Y direction is described, while the present disclosure is not limited thereto. The via 35A and the via 35C may be circular. In FIG. 9, an example in which the via 35A and the via 35C are disposed overlapping with each other in the Z direction is illustrated, but as illustrated in FIG. 10, the via 35A and the via 35C may be disposed not overlapping with each other in the Z direction. As illustrated in FIG. 11, a plurality of vias 35C may be disposed on the conductive layer 35B.

1.3 Manufacturing Method of Semiconductor Memory Device

Hereinafter, a manufacturing method of the conductive layer 35 on the memory pillar will be described.

1.3.1 Manufacturing Method of Conductive Layer 35

Descriptions will be made on the manufacturing method of the conductive layer 35 including the via 35A, the conductive layer 35B, and the via 35C illustrated in FIGS. 8 and 9 by using FIGS. 12 to 21. FIGS. 12 to 21 are cross-sectional views illustrating the manufacturing method of the via 35A, the conductive layer 35B and the via 35C in the first embodiment. FIGS. 12 to 17, 19, and 21 illustrate cross-sections taken along the B-B line in FIG. 7, in a manufacturing process of the conductive layer 35. FIGS. 18 and 20 illustrate cross-sections taken along the C-C line in FIG. 7, in the manufacturing process of the conductive layer 35.

Figure 12:
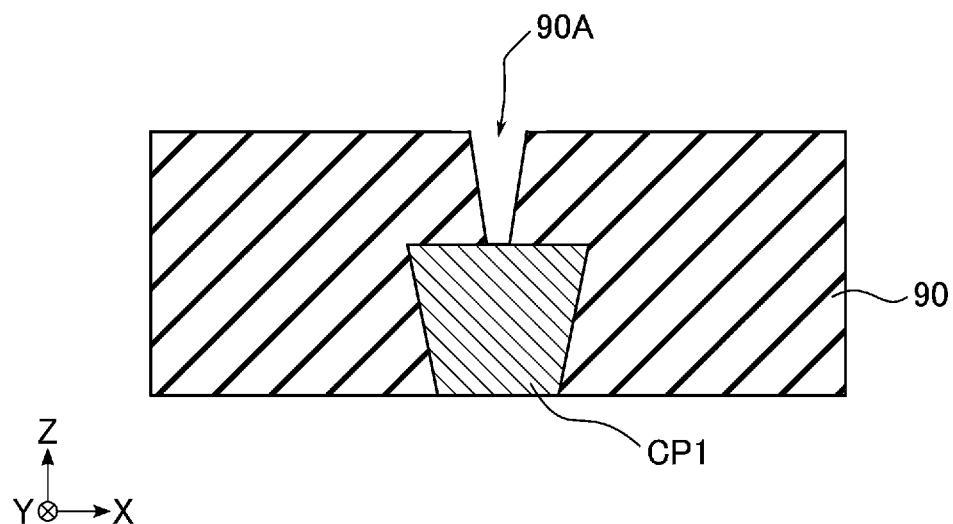
FIG. 12 is a cross-sectional view illustrating a manufacturing method of the vias and the conductive layer in the semiconductor memory device of the first embodiment.

First, as illustrated in FIG. 12, a hole 90A for embedding the via 35A is formed in the insulating layer 90 on the contact plug CP1. Specifically, the region from the upper surface of the insulating layer 90 to the upper surface of the contact plug CP1 is removed by a reactive ion etching (RIE) method so that the hole 90A for the via 35A is formed. The insulating layer 90 may include, for example, a silicon oxide layer. The contact plug CP1 may contain a conductive material, for example, tungsten (W), aluminum (Al), or titanium (Ti).

Figure 13:
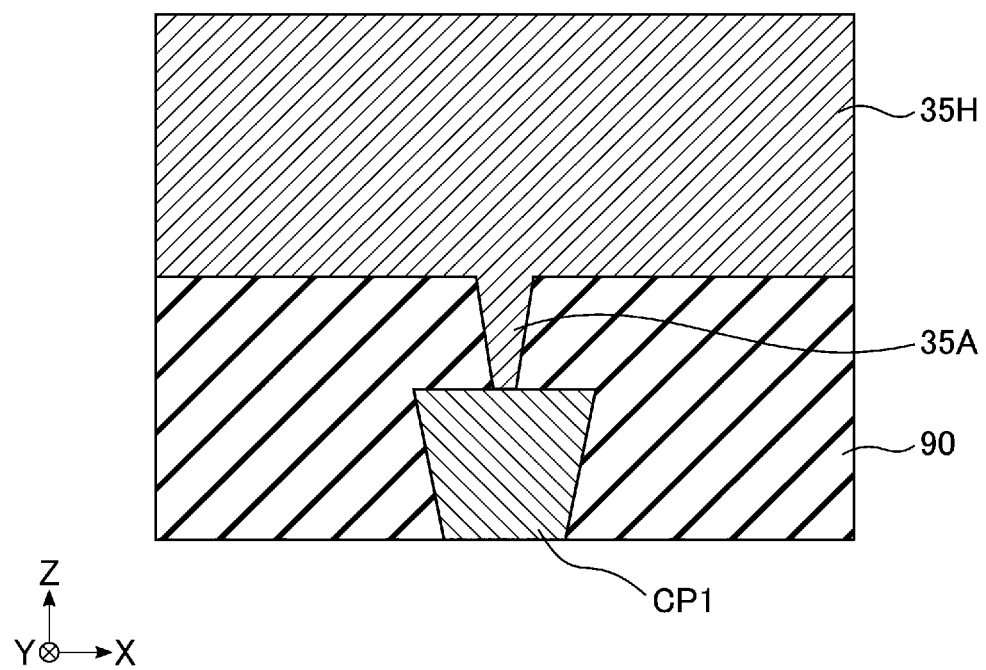
FIG. 13 is a cross-sectional view illustrating the manufacturing method of the vias and the conductive layer in the semiconductor memory device of the first embodiment.

Subsequently, as illustrated in FIG. 13, a conductive layer 35H is formed in the hole 90A for the via 35A and on the insulating layer 90. Specifically, the conductive layer 35H is formed in the hole 90A and on the insulating layer 90 by an atomic layer deposition (ALD) method, a chemical vapor deposition (CVD) method, or a sputtering method. The height (or thickness) of the conductive layer 35H formed on the insulating layer 90 may be a height (or length or thickness) obtained by adding the height (or thickness) of the conductive layer 35B and the height (or length) of the via 35C. The conductive layer 35H may contain, for example, tungsten or aluminum.

Figure 14:
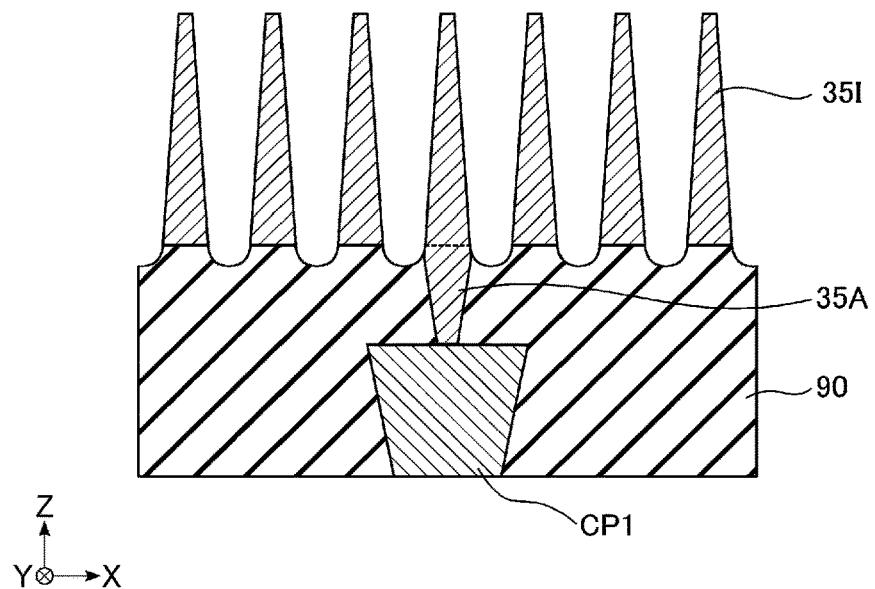
FIG. 14 is a cross-sectional view illustrating the manufacturing method of the vias and the conductive layer in the semiconductor memory device of the first embodiment.

Next, as illustrated in FIG. 14, a plurality of conductive layers 35I are formed by patterning the conductive layer 35H. Each of the conductive layers 35I may have a height obtained by adding the height of the conductive layer 35B and the height of the via 35C. Specifically, the conductive layer 35H on the insulating layer 90 may be etched by using a sidewall processing process or a double patterning technique so as to form the conductive layers 35I arranged at predetermined intervals in the X direction.

Figure 15:
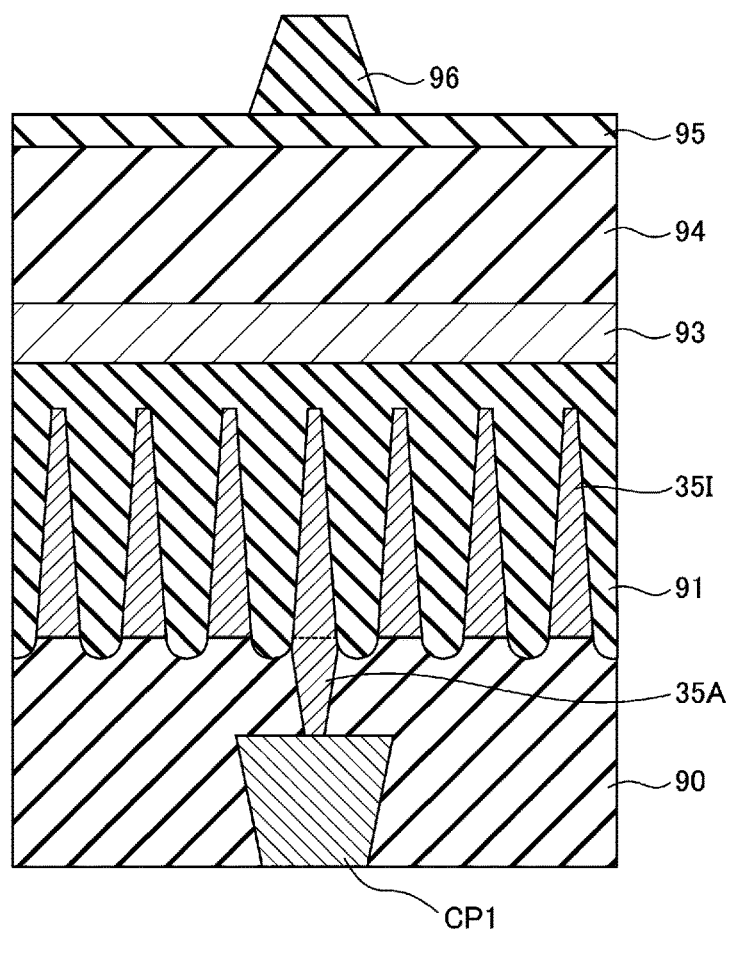
FIG. 15 is a cross-sectional view illustrating the manufacturing method of the vias and the conductive layer in the semiconductor memory device of the first embodiment.

Next, as illustrated in FIG. 15, the insulating layer 91 is formed on the structure illustrated in FIG. 14, that is, on the insulating layer 90 and on the conductive layers 35I. Further, an amorphous silicon layer 93, a carbon layer 94, and an oxide layer 95 are formed in this order on the insulating layer 91. Further, a resist layer 96 is formed on the oxide layer 95. Specifically, the insulating layer 91 may be formed on the insulating layer 90 and on the conductive layers 35I by the ALD method or the CVD method. The amorphous silicon layer 93 may be formed on the insulating layer 91 by the ALD method or the CVD method. Subsequently, the carbon layer 94 and the oxide layer 95 are formed in this order on the amorphous silicon layer 93. Further, the patterned resist layer 96 is formed on the oxide layer 95. The carbon layer 94, the oxide layer 95, and the resist layer 96 constitute a multilayer resist structure.

The carbon layer 94 may be, for example, a spin on carbon (SOC) layer coated on the amorphous silicon layer 93 by spin coating. The oxide layer 95 may be, for example, a spin on glass (SOG) layer coated on the carbon layer 94 by spin coating.

Figure 16:
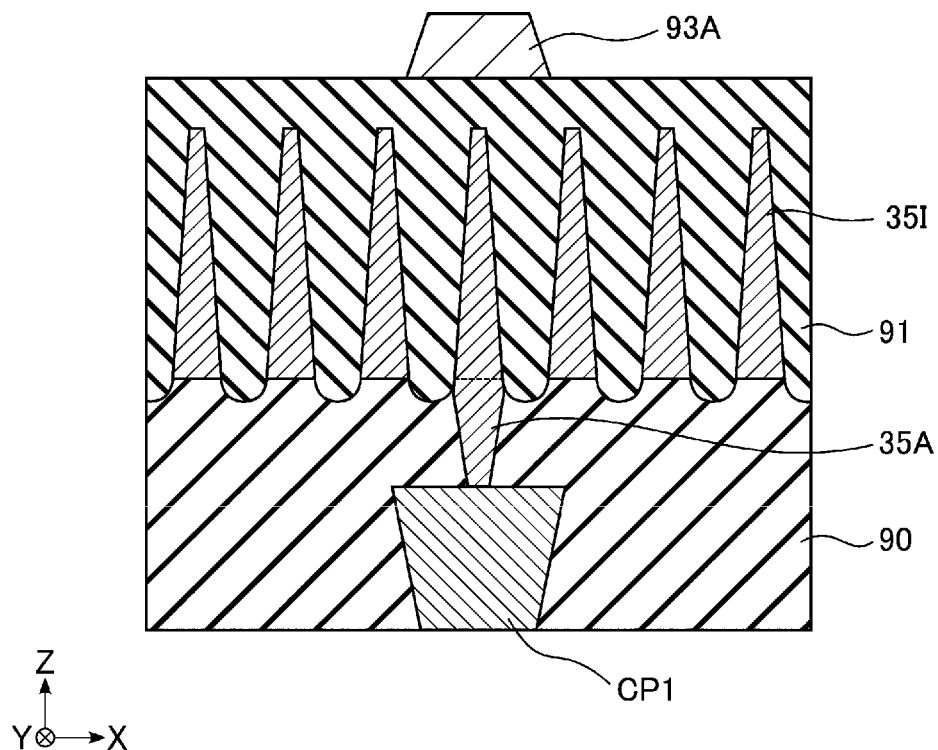
FIG. 16 is a cross-sectional view illustrating the manufacturing method of the vias and the conductive layer in the semiconductor memory device of the first embodiment.

Next, the structure illustrated in FIG. 15 is etched by the RIE method such that as illustrated in FIG. 16, an amorphous silicon layer 93A remains only above the conductive layer 35I connected to the contact plug CP1.

Figure 17:
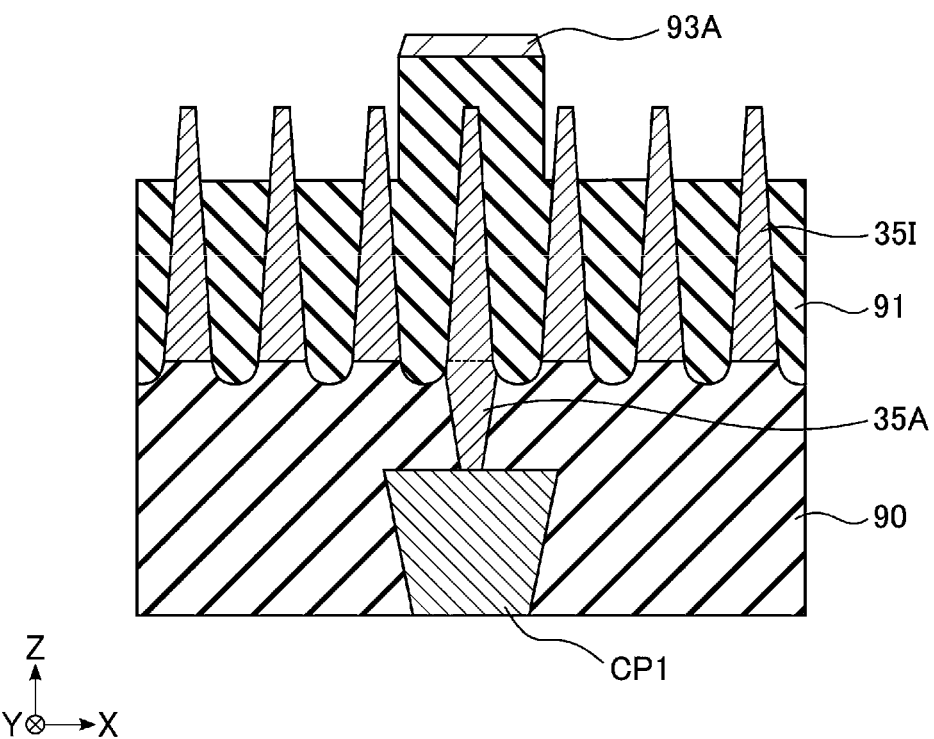
FIG. 17 is a cross-sectional view illustrating the manufacturing method of the vias and the conductive layer in the semiconductor memory device of the first embodiment.
Figure 18:
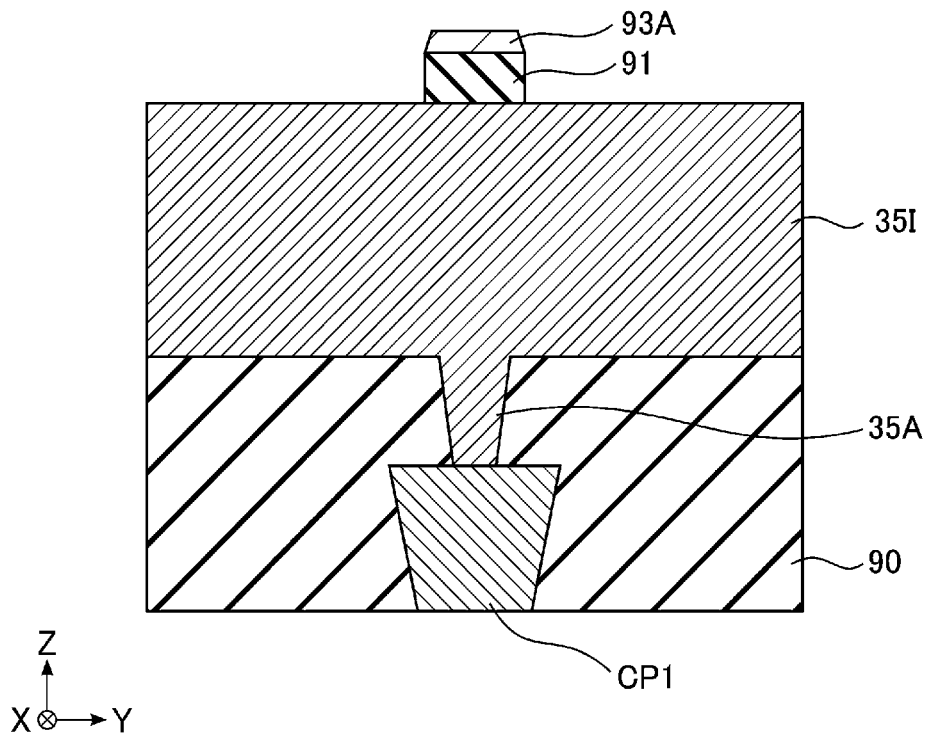
FIG. 18 is a cross-sectional view illustrating the manufacturing method of the vias and the conductive layer in the semiconductor memory device of the first embodiment.

Next, the structure illustrated in FIG. 16 is etched by the RIE method such that as illustrated in FIGS. 17 and 18, the insulating layer 91 in a region where the amorphous silicon layer 93A is not disposed is removed. Accordingly, except for the conductive layer 35I connected to the contact plug CP1, top portions of the other conductive layers 35I are exposed from the insulating layer 91. Here, the amorphous silicon layer 93A and the insulating layer 91 are left above the conductive layer 35I connected to the contact plug CP1.

Figure 19:
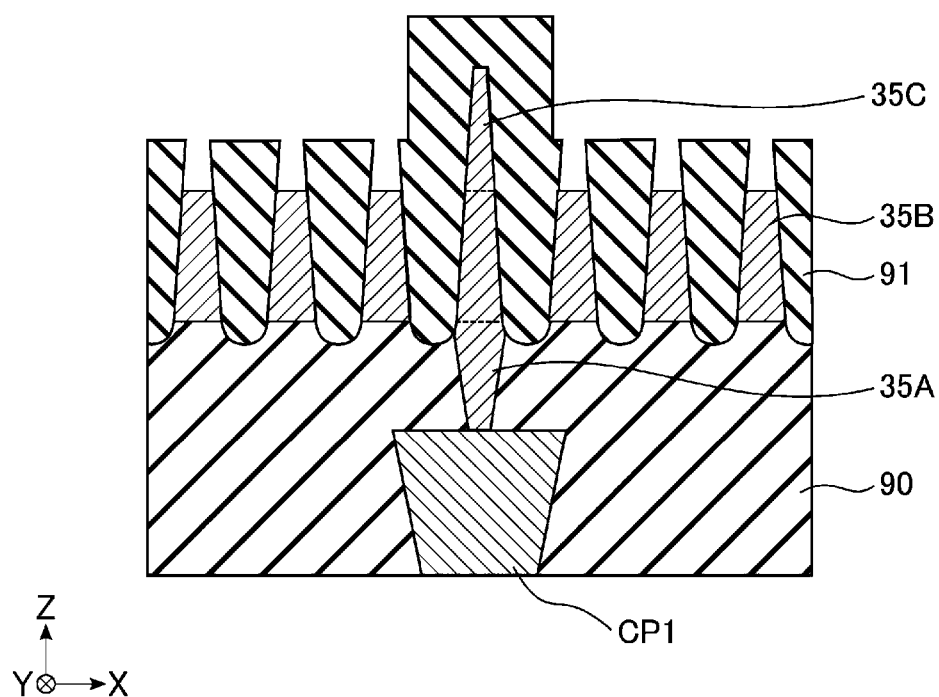
FIG. 19 is a cross-sectional view illustrating the manufacturing method of the vias and the conductive layer in the semiconductor memory device of the first embodiment.
Figure 20:
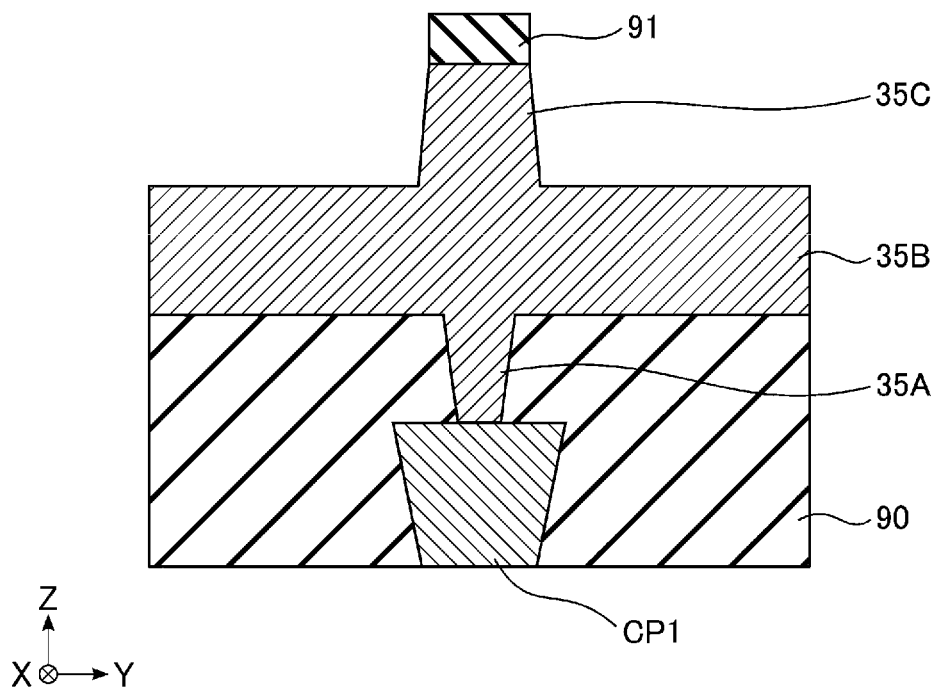
FIG. 20 is a cross-sectional view illustrating the manufacturing method of the vias and the conductive layer in the semiconductor memory device of the first embodiment.

Next, the structure illustrated in FIGS. 17 and 18 is etched by the RIE method such that as illustrated in FIGS. 19 and 20, the exposed conductive layers 35I are removed from the top surface of the insulating layer 91 to the middle of the height of the insulating layer 91. As a result, the conductive layers 35B and the via 35C are formed.

Figure 21:
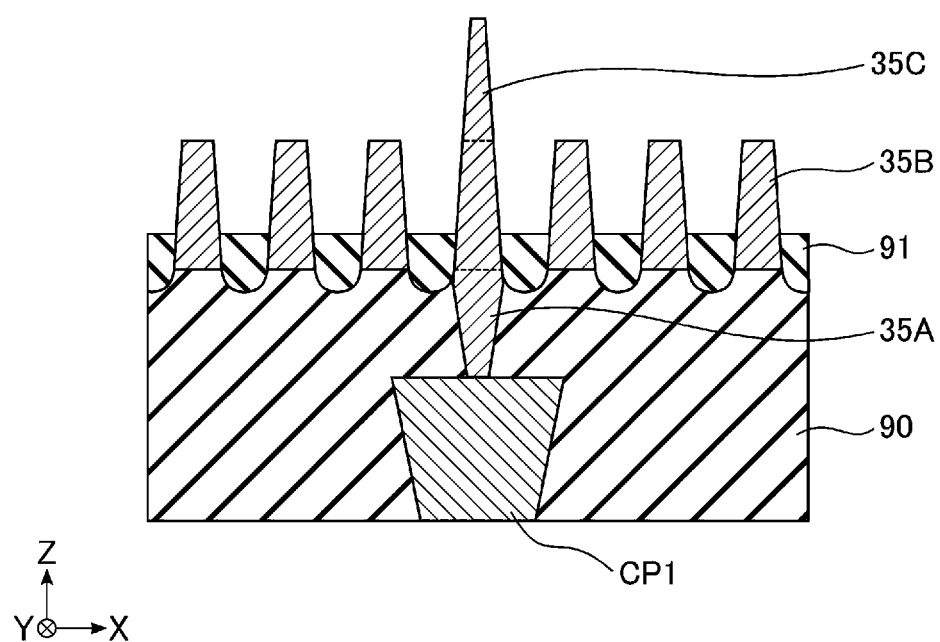
FIG. 21 is a cross-sectional view illustrating the manufacturing method of the vias and the conductive layer in the semiconductor memory device of the first embodiment.

Next, the structure illustrated in FIGS. 19 and 20 is etched by the RIE method such that, as illustrated in FIG. 21, the insulating layer 91 between the conductive layers 35B is removed from the top surface of the conductive layer 35B to the middle of the height of the conductive layer 35B.

Next, as illustrated in FIGS. 8 and 9, the insulating layer 92 is formed by the ALD method or the CVD method, on the structure illustrated in FIG. 21, that is, on the insulating layer 91 and on the conductive layer 35B. Further, the conductive layer 36 is formed on the via 35C.

Through the above-described manufacturing process, the via 35A, the conductive layer 35B, and the via 35C are manufactured on the contact plug CP1 on the memory pillar MP.

1.4 Effect of First Embodiment

According to the first embodiment, it is possible to reduce the size of the semiconductor memory device (or the size of the semiconductor chip). Further, it is possible to improve the operation reliability in the semiconductor memory device.

Hereinafter, the effect of the first embodiment will be described in detail.

In the first embodiment, the via (or the contact plug) 35A provided above the semiconductor substrate, the conductive layer 35B provided on the via 35A, and the via (or the contact plug) 35C provided on the conductive layer 35B are provided. The via 35A, the conductive layer 35B, and the via 35C are one continuous layer. That is, the via 35A, the conductive layer 35B, and the via 35C are one layer that is integrally formed, and no boundary region is present between the via 35A and the conductive layer 35B, and between the conductive layer 35B and the via 35C. According to this structure, it is possible to reduce an alignment shift between the via 35A, the conductive layer 35B, and the via 35C, which occurs in a case where the via 35A, the conductive layer 35B, and the via 35C are separately formed.

For example, in the semiconductor memory device having a structure where the memory array chip 100 is bonded to the peripheral circuit chip 200, the via 35C that connects from the conductive layer 35B (e.g., the bit line BL) to the conductive pad 38 may be formed immediately above the conductive layer 35B. In this case, since the arrangement interval of the conductive layers 35B is fine, a high degree of alignment accuracy between the conductive layer 35B and the via 35C may be required.

In the embodiment, since the via 35A, the conductive layer 35B, and the via 35C are one layer, it is possible to reduce the alignment shift occurring between the via 35A, the conductive layer 35B, and the via 35C. Accordingly, it is possible to comply with the above-described requirement for the high degree of alignment accuracy.

Further, in the structure design of the semiconductor memory device, by taking the margin of the alignment accuracy into consideration, the sizes and intervals of the conductive layer and the vias may be determined, and the size of the semiconductor memory device may be determined. According to the embodiment, since the alignment accuracy margin may be reduced, the sizes and intervals of the conductive layer and the vias may be reduced, so that the size of the semiconductor memory device may be reduced.

That is, since the embodiment has a structure in which the alignment accuracy margin required for the via 35A, the conductive layer 35B, and the via 35C may be reduced, the sizes and arrangement intervals of the via 35A, the conductive layer 35B, and the via 35C may be reduced, and eventually, the size of the semiconductor memory device may be reduced.

Since the alignment shift occurring between the via 35A, the conductive layer 35B, and the via 35C may be reduced, it is possible to reduce an increase of an electrical resistance, which is caused by a contact area reduction, etc., due to the alignment shift between the via 35A, the conductive layer 35B, and the via 35C. Thus, it is possible to improve the operation reliability.

As described above, according to the semiconductor memory device of the first embodiment, the size (or the semiconductor chip size) of the semiconductor memory device may be reduced. Also, the operation reliability in the semiconductor memory device may be improved.

2. Second Embodiment

Next, a semiconductor memory device of a second embodiment will be described. In the second embodiment, a via, a wiring layer, and a via provided in an order on a CMOS circuit CM constituting a peripheral circuit will be described as an example. In the second embodiment, differences from the first embodiment will be mainly described.

2.1 Structure of Semiconductor Memory Device

Hereinafter, an example of a structure of the semiconductor memory device of the second embodiment will be described.

Figure 22:
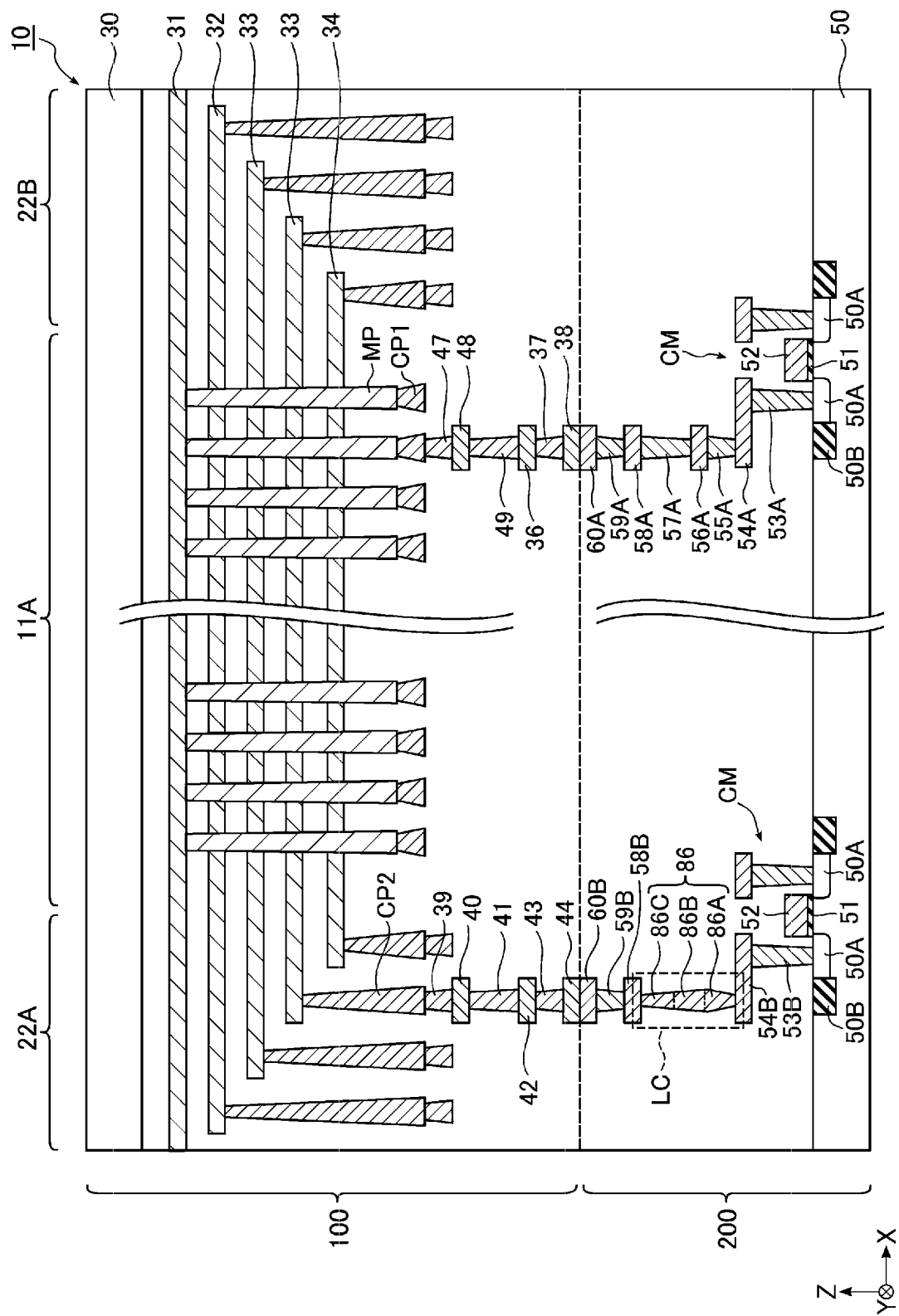
FIG. 22 is a cross-sectional view of a semiconductor memory device of a second embodiment which is taken along the XZ plane.

FIG. 22 is a cross-sectional view of the semiconductor memory device of the second embodiment which is taken along the XZ plane. Further, in FIG. 22, interlayer insulating films between conductive layers are omitted. Like the semiconductor memory device illustrated in FIG. 4, the semiconductor memory device 10 has a structure in which the memory array chip 100 is bonded to the peripheral circuit chip 200.

Hereinafter, a cross-sectional structure in the memory array chip 100 will be described in detail.

On the semiconductor substrate 30, the conductive layer 31 is provided via an insulating layer in the negative Z direction. On the conductive layer 31, a stacked body is provided, in which the conductive layer 32, the plurality of conductive layers 33, and the conductive layer 34 are stacked in the negative Z direction with interposed insulating layers. The conductive layers 31 to 34 extend in the X direction. Each of the conductive layers 31 to 34 may have a plate shape along (or parallel to) the XY plane (or the surface of the semiconductor substrate 30).

In the stacked body including the conductive layers 32 to 34, the plurality of columnar memory pillars MP are provided. The contact plug CP1 is provided in the negative Z direction on each memory pillar MP, and a via 47 is provided on the contact plug CP1. On the via 47, a conductive layer 48, a via 49, the conductive layer 36, the via 37, and the conductive pad 38 are provided in this order in the negative Z direction. Other structures are the same as the structures of the semiconductor memory device 10 illustrated in FIG. 4.

Hereinafter, a cross-sectional structure in the peripheral circuit chip 200 will be described in detail.

On the semiconductor substrate 50, for example, a CMOS circuit CM including an nMOS transistor and a pMOS transistor is provided. The via 53B is provided in the positive Z direction in each of the source region 50A and the drain region 50A, and the conductive layer 54B is provided on each via 53B. On the conductive layer 54B, a via 86A, a conductive layer 86B, and a via 86C are provided in this order in the positive Z direction. On the via 86C, the conductive layer 58B, the via 59B, and the conductive pad 60B are provided in this order in the positive Z direction. Other structures are the same as the structures of the semiconductor memory device 10 illustrated in FIG. 4.

Next, another structure example of the semiconductor memory device of the second embodiment will be described. In the example illustrated in FIG. 22, while the semiconductor memory device 10 in which the memory array chip 100 is bonded to the peripheral circuit chip 200 is described as an example, the present disclosure is not limited thereto, and may also be applicable to a semiconductor memory device having another structure.

Figure 23:
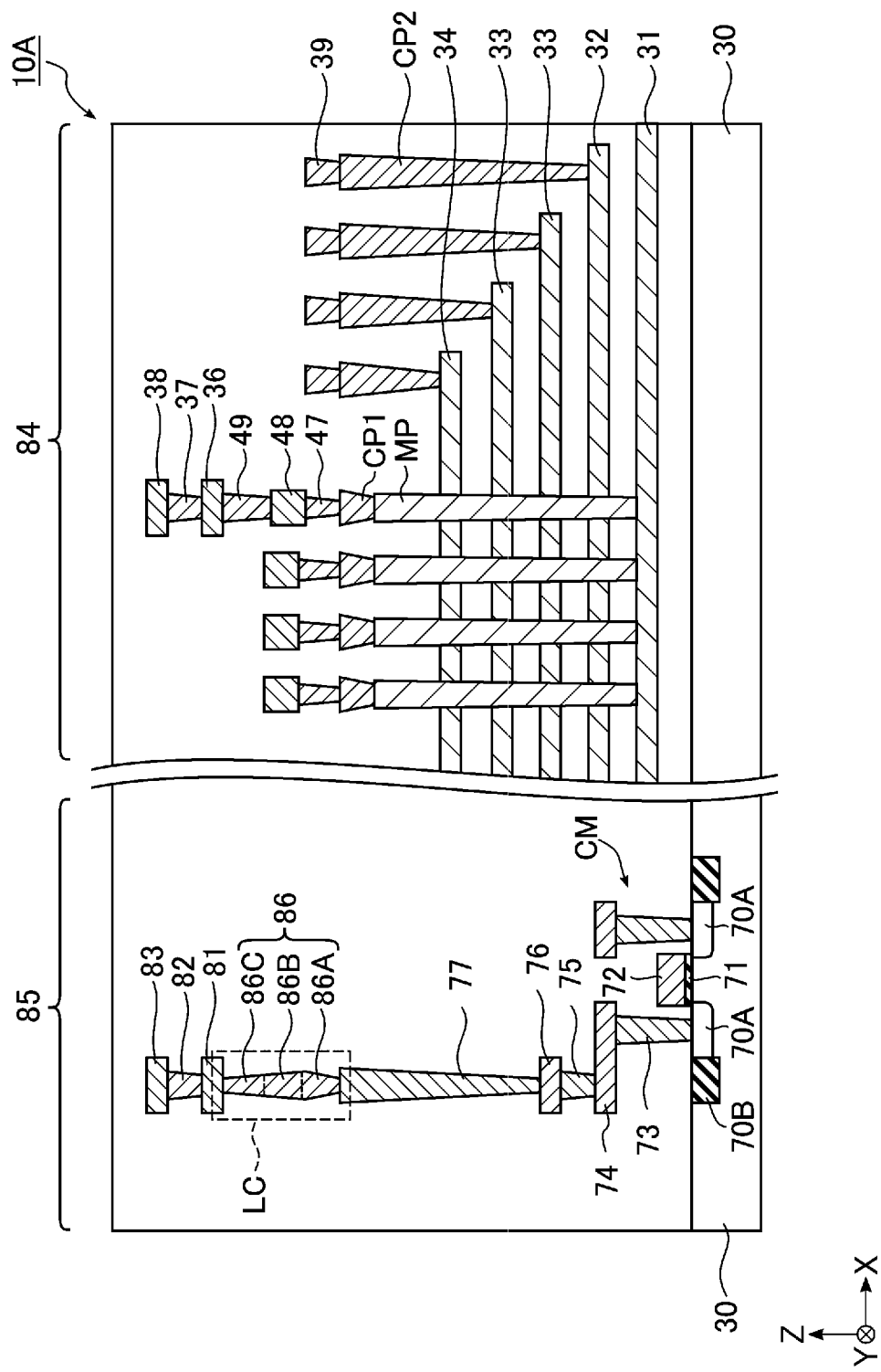
FIG. 23 is a cross-sectional view illustrating another structure example of the semiconductor memory device of the second embodiment.

FIG. 23 is a cross-sectional view illustrating another structure example of the semiconductor memory device of the second embodiment. For example, as illustrated in FIG. 23, the present disclosure may also be applicable to the semiconductor memory device 10A in which the area 84 where memory cells are formed and the area 85 where peripheral circuits are formed are provided on one semiconductor substrate 30. Further, in FIG. 23, interlayer insulating films between conductive layers are omitted.

Hereinafter, the cross-sectional structure of the area 84 where the memory cells are formed will be described.

The contact plug CP1 is provided in the positive Z direction on the memory pillar MP, and the via 47 is provided on the contact plug CP1. On the via 47, the conductive layer 48, the via 49, the conductive layer 36, the via 37, and the conductive layer 38 are provided in this order in the positive Z direction. Other structures are the same as the structures of the semiconductor memory device 10A illustrated in FIG. 5.

Hereinafter, the cross-sectional structure of the area 85 where the peripheral circuits are formed will be described.

On the semiconductor substrate 30, for example, a CMOS circuit CM including an nMOS transistor and a pMOS transistor is provided. The via 73 is provided in the positive Z direction in each of the source region 70A and the drain region 70A, and the conductive layer 74 is provided on each via 73. On the conductive layer 74, the via 75, the conductive layer 76, and the via 77 are provided in this order in the positive Z direction. On the via 77, the via 86A, the conductive layer 86B, and the via 86C are provided in this order in the positive Z direction. On the via 86C, the conductive layer 81, the via 82, and the conductive layer 83 are provided in this order in the positive Z direction. Other structures are the same as the structures of the semiconductor memory device 10A illustrated in FIG. 5.

2.1.1 Structure of Conductive Layer 86 on Peripheral Circuit

An example of a structure of the conductive layer 86 illustrated in a region LC in FIGS. 22 and 23 will be described by using FIGS. 24 and 25. Each conductive layer 86 is one layer including the via 86A, the conductive layer 86B, and the via 86C.

Figure 24:
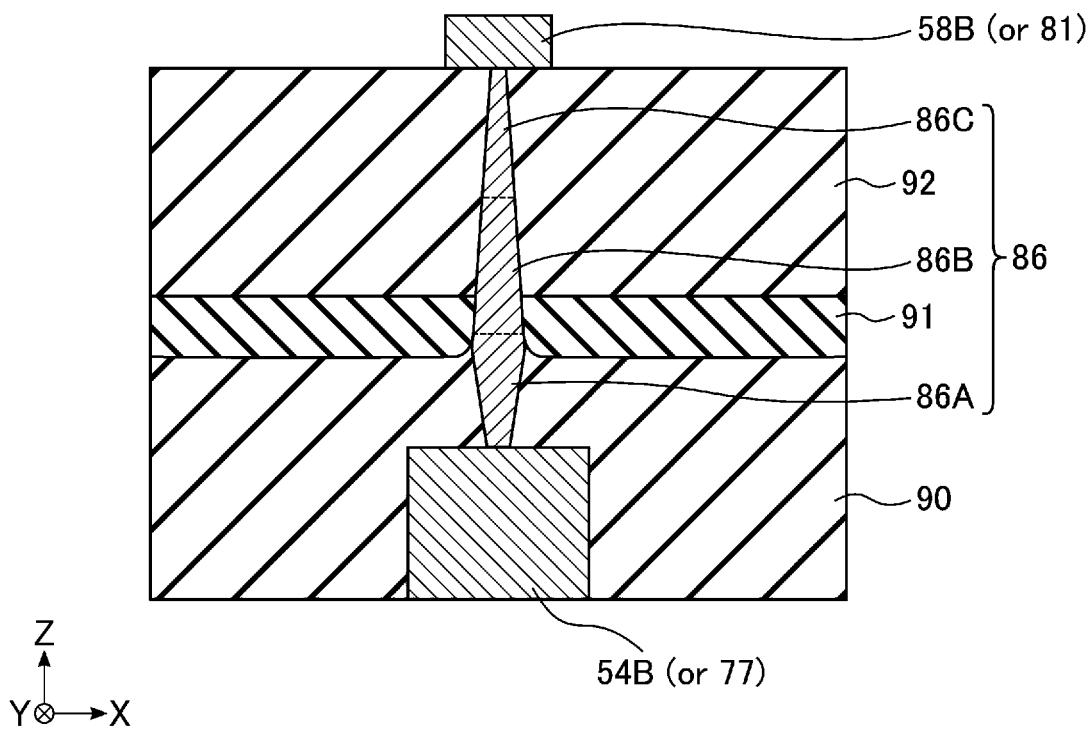
FIG. 24 is a cross-sectional view taken along the XZ plane of vias and a conductive layer in the semiconductor memory device of the second embodiment.

FIG. 24 is a cross-sectional view of the conductive layer 86 in the second embodiment which is taken along the XZ plane, and illustrates a cross-section of the via 86A, the conductive layer 86B, and the via 86C which is taken along the XZ plane. FIG. 25 is a cross-sectional view of the conductive layer 86 which is taken along the YZ plane, and illustrates a cross-section of the via 86A, the conductive layer 86B, and the via 86C which is taken along the YZ plane.

Figure 25:
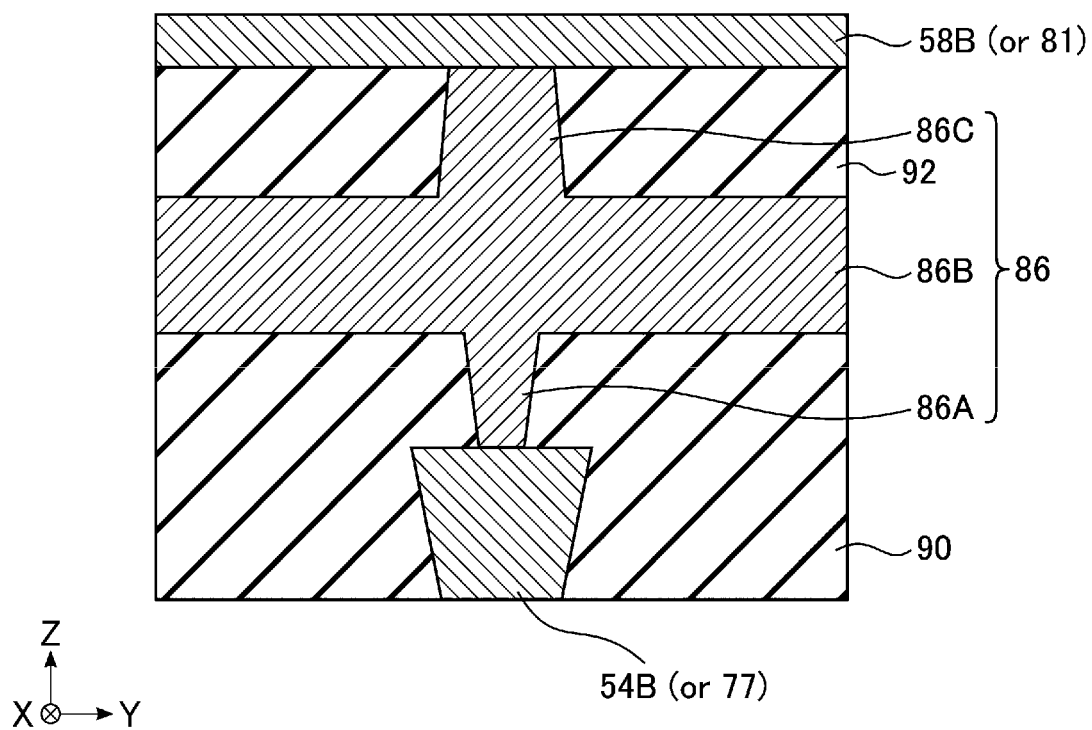
FIG. 25 is a cross-sectional view taken along the YZ plane of the vias and the conductive layer in the semiconductor memory device of the second embodiment.

As illustrated in FIGS. 24 and 25, the plurality of conductive layers 86B extend in the Y direction. The conductive layers 86B extending in the Y direction are arranged in the X direction at predetermined intervals. In each of the conductive layers 86B, the via 86A and the via 86C are disposed in the Z direction. Each via 86A extends in the Z direction, and is provided below each conductive layer 86B. That is, each via 86A is provided on the semiconductor substrate (50 or 30) side of each conductive layer 86B, or on the conductive layer 54B side or the via 77 side. Each via 86C extends in the Z direction, and is provided above each conductive layer 86B. That is, each via 86C is provided on the conductive layer 58B side or the conductive layer 81 side of each conductive layer 86B.

The via 86A is formed continuous to the conductive layer 86B. No boundary region is present between the via 86A and the conductive layer 86B. The via 86C is formed continuous to the conductive layer 86B. No boundary region is present between the via 86C and the conductive layer 86B. That is, the conductive layer 86B has the via 86A protruding downward, and the via 86C protruding upward.

Hereinafter, a structure of the via 86A, the conductive layer 86B, and the via 86C will be described in detail by using FIGS. 24 and 25.

The conductive layer 54B (or the via 77) is provided in the insulating layer 90. The via 86A is provided in the insulating layer 90 on the conductive layer 54B. The conductive layer 86B is provided on the via 86A and on the insulating layer 90. The insulating layer 91 is provided in a region on the insulating layer 90 where the conductive layer 86B is not present. The insulating layer 92 is provided on the insulating layer 91 and on the conductive layer 86B. The via 86C is provided in the insulating layer 92 on the conductive layer 86B. Further, the conductive layer 58B (or 81) is provided on the via 86C.

In the X direction, a first width of the conductive layer 86B at a position close to (or connected to) the via 86A may be larger than a second width of the conductive layer 86B at a position farther from the via 86A than the position of the first width. The via 86A has a columnar shape extending in the Z direction, and a first diameter of the via 86A close to (or connected to) the conductive layer 86B may be larger than a second diameter of the via 86A at a position farther from the conductive layer 86B than the position of the first diameter. The via 86C has a columnar shape extending in the Z direction, and a third diameter of the via 86C at a position close to (or connected to) the conductive layer 86B may be larger than a fourth diameter of the via 86C at a position farther from the conductive layer 86B than the position of the third diameter. In the X direction, the width of the conductive layer 86B may be larger than the diameter of the via 86C.

The via 86A, the conductive layer 86B, and the via 86C are continuously formed between the conductive layer 54B (or the via 77) and the conductive layer 58B (or 81). The via 86A, the conductive layer 86B, and the via 86C may be electrically connected to each other, and may electrically connect the conductive layer 54B and the conductive layer 58B to each other.

Further, as described above in the first embodiment, an example in which each of the via 86A and the via 86C may be an oval or an ellipse having a long diameter in the Y direction is described, while the present disclosure is not limited thereto. The vias 86A and 86C may be circular. In FIG. 25, an example in which the via 86A and the via 86C are disposed overlapping with each other in the Z direction is illustrated, but the via 86A and the via 86C may be disposed not overlapping with each other in the Z direction. In addition, a plurality of vias 86C may be disposed on the conductive layer 86B.

2.2 Manufacturing Method of Conductive Layer 86

A manufacturing method of the conductive layer 86 on the peripheral circuit is the same as the manufacturing method described in the first embodiment, except for following features.

In many cases, widths and arrangement intervals of the via 86A, the conductive layer 86B, and the via 86C on the peripheral circuit CM in the X direction may be set larger than those of the via 35A, the conductive layer 35B and the via 35C described in the first embodiment. Thus, in the second embodiment, the sidewall processing process that is used in the process illustrated in FIG. 14 in the first embodiment may not be used for forming the conductive layer 86B and the via 86C. The manufacturing method in the second embodiment is almost the same as the manufacturing method in the first embodiment, except that the manufacturing method of the second embodiment does not use the above-described sidewall processing process.

2.3 Effect of Second Embodiment

According to the second embodiment, as in the above-described first embodiment, it is possible to reduce the size of the semiconductor memory device (or the size of the semiconductor chip). Further, it is possible to improve the operation reliability in the semiconductor memory device. Other effects, etc., are also the same as those in the first embodiment.

3. Other Modifications, Etc

In the above-described embodiments, although the semiconductor memory device 10 in which the memory array chip 100 is bonded to the peripheral circuit chip 200, and the semiconductor memory device 10A in which the area 84 where memory cells are formed and the area 85 where peripheral circuits are formed are provided on one semiconductor substrate 30 are described as an example, the present disclosure is not limited thereto, and may also be applicable to semiconductor devices having other structures.

Further, in the above-described embodiments, although an NAND-type flash memory is described as an example of the semiconductor memory device, the the semiconductor memory device is not limited to the NAND-type flash memory, and may also be applicable to other general semiconductor memories, and further to various storage devices other than semiconductor memories.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device comprising:
   a stacked body including a plurality of conductive layers stacked in a first direction;
   a first pillar including a first semiconductor layer and extending in the stacked body in the first direction;
   a second pillar including a second semiconductor layer and extending in the stacked body in the first direction;
   a first contact plug extending in the first direction, provided above the stacked body, and electrically connected to the first semiconductor layer;
   a second contact plug extending in the first direction, provided above the stacked body, and electrically connected to the second semiconductor layer;
   a first charge storage layer provided between the plurality of conductive layers and the first semiconductor layer;
   a second charge storage layer provided between the plurality of conductive layers and the second semiconductor layer;
   a first interconnection provided above and on the first contact plug and extending in a second direction crossing the first direction;
   a second interconnection provided above and on the second contact plug and extending in the second direction and arranged in a third direction of the first interconnection, the third direction crossing the first direction and the second direction;
   a third contact plug provided above and on the first interconnection and extending in the first direction; and
   a fourth contact plug provided above and on the second interconnection and extending in the first direction;
   wherein the first contact plug, the first interconnection, and the third contact plug are made of one continuous layer,
   the second contact plug, the second interconnection, and the fourth contact plug are made of one continuous layer,
   the second contact plug is disposed in a position in the second direction different from the first contact plug, and
   the fourth contact plug is disposed in a position in the second direction different from the third contact plug.

2. The semiconductor memory device according to claim 1, wherein
   the first contact plug and the first interconnection have no boundary region between them, and
   the first interconnection and the third contact plug have no boundary region between them.

3. The semiconductor memory device according to claim 1, wherein in the third direction intersecting the first direction and the second direction, a first width of the first interconnection at a first position is larger than a second width of the first interconnection at a second position farther from the first contact plug than the first position.

4. The semiconductor memory device according to claim 1, wherein
   the first contact plug has a columnar shape extending in the first direction, and
   a first diameter of the first contact plug at a first position is larger than a second diameter of the first contact plug at a second position farther from the first interconnection than the first position.

5. The semiconductor memory device according to claim 1, wherein
   the third contact plug has a columnar shape extending in the first direction, and
   a third diameter of the third contact plug at a first position is larger than a fourth diameter of the third contact plug at a second position farther from the first interconnection than the first position.

6. The semiconductor memory device according to claim 1, wherein in the third direction intersecting the first direction and the second direction, a width of the first interconnection is larger than a diameter of the third contact plug.

7. The semiconductor memory device according to claim 1, wherein
   the plurality of conductive layers stacked in the first direction is disposed between a substrate and the first contact plug.

8. The semiconductor memory device according to claim 7, wherein portions where the plurality of conductive layers and the first pillar intersect each other are configured to function as memory cell transistors.

9. The semiconductor memory device according to claim 8, wherein
   the first interconnection is a bit line configured to have a current flow through it from the memory cell transistors, and the plurality of conductive layers are word lines connected to gates of the memory cell transistors.

10. The semiconductor memory device according to claim 1, wherein a length of the first interconnection in the second direction is greater than a length of the first interconnection in the first direction.

11. A semiconductor memory device comprising:
a stacked body including a plurality of conductive layers stacked in a first direction;
a first pillar including a first semiconductor layer and extending in the stacked body in the first direction;
a second pillar including a second semiconductor layer and extending in the stacked body in the first direction;
a first contact plug, provided above the stacked body, and electrically connected to the first semiconductor layer;
a first interconnection provided above the first contact plug in the first direction, the first interconnection being provided on the first contact plug and extending in a second direction crossing the first direction; and
a second contact plug provided above the first interconnection in the first direction, the second contact plug being provided on the first interconnection;
a first charge storage layer provided between the plurality of conductive layers and the first semiconductor layer; and
a second charge storage layer provided between the plurality of conductive layers and the second semiconductor layer,
wherein in a third direction crossing the first direction and the second direction, a first width of the first interconnection at a first position is larger than a second width of the first interconnection at a second position farther from the first contact plug than the first position of the first interconnection, and
the first contact plug, the first interconnection, and the second contact plug are made of one continuous layer.

12. The semiconductor memory device according to claim 11, wherein the first contact plug, the first interconnection, and the second contact plug are made of one continuous layer.

13. The semiconductor memory device according to claim 11, wherein
the first contact plug and the first interconnection have no boundary region between them, and
the first interconnection and the second contact plug have no boundary region between them.

14. The semiconductor memory device according to claim 11, wherein
the first contact plug extends in the first direction, and
the second contact plug extends in the first direction.

15. The semiconductor memory device according to claim 14, wherein
the first contact plug has a columnar shape extending in the first direction, and
a first diameter of the first contact plug at a first position is larger than a second diameter of the first contact plug at a second position farther from the first interconnection than the first position of the first contact plug.

16. The semiconductor memory device according to claim 14, wherein
the second contact plug has a columnar shape extending in the first direction, and
a third diameter of the second contact plug at a first position is larger than a fourth diameter of the second contact plug at a second position farther from the first interconnection than the first position of the second contact plug.

17. The semiconductor memory device according to claim 14, wherein
the plurality of conductive layers stacked in the first direction is disposed between a substrate and the first contact plug.

18. The semiconductor memory device according to claim 17, wherein portions where the plurality of conductive layers and the first pillar intersect each other are configured to function as memory cell transistors.

19. The semiconductor memory device according to claim 18, wherein
the first interconnection is a bit line configured to have a current flow through it from the memory cell transistors, and
the plurality of conductive layers are word lines connected to gates of the memory cell transistors.

20. The semiconductor memory device according to claim 11, wherein in the third direction, a width of the first interconnection is larger than a diameter of the second contact plug.

* * * * *